US012739965B2

(12) United States Patent
Toleno et al.

(10) Patent No.: US 12,739,965 B2
(45) Date of Patent: Sep. 15, 2026

(54) THERMOPLASTIC INTERPOSER

(71) Applicant: Meta Platforms Technologies, LLC, Menlo Park, CA (US)

(72) Inventors: Brian Toleno, Cupertino, CA (US); Michael Nikkhoo, Saratoga, CA (US); Arman Boromand, Issaquah, WA (US); Sheng Ye, Redmond, WA (US); Andrew John Ouderkirk, Kirkland, WA (US); Jonathan Robert Peterson, Woodinville, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 365 days.

(21) Appl. No.: 18/378,010

(22) Filed: Oct. 9, 2023

(65) Prior Publication Data

US 2024/0121882 A1 Apr. 11, 2024

Related U.S. Application Data

(60) Provisional application No. 63/414,804, filed on Oct. 10, 2022.

(51) Int. Cl.

| | |
|---|---|
| ***H05K 1/02*** | (2006.01) |
| ***H05K 1/11*** | (2006.01) |
| ***H05K 1/14*** | (2006.01) |
| ***H05K 3/36*** | (2006.01) |

(52) U.S. Cl.
CPC ........... *H05K 1/0209* (2013.01); *H05K 1/113* (2013.01); *H05K 1/145* (2013.01); *H05K 3/368* (2013.01); *H05K 2201/10378* (2013.01)

(58) Field of Classification Search
CPC ...... H05K 1/0209; H05K 1/113; H05K 1/144; H05K 1/145; H05K 1/189; H05K 3/368; H05K 2201/042; H05K 2201/10378
USPC .......................................................... 174/258
See application file for complete search history.

(56) References Cited

U.S. PATENT DOCUMENTS

| | | | | |
|---|---|---|---|---|
| 5,086,558 A | | 2/1992 | Grube et al. | |
| 5,181,167 A * | | 1/1993 | Davidson .............. | H05K 7/023 174/16.3 |
| 5,445,883 A | | 8/1995 | Kobayashi et al. | |
| 5,723,205 A | | 3/1998 | Millette et al. | |
| 6,618,267 B1 * | | 9/2003 | Dalal ..................... | H05K 1/144 361/767 |
| 6,739,040 B1 | | 5/2004 | Nakamura et al. | |

(Continued)

*Primary Examiner* — Timothy J Thompson
*Assistant Examiner* — Michael F Mcallister
(74) *Attorney, Agent, or Firm* — McDermott Will & Schulte LLP

(57) ABSTRACT

A thermoplastic interposer formed of ordered polymer sheets that may be configured to act as an interconnect and as a thermal energy spreader. In examples, the thermoplastic interposer may include one or more extensions or wings to further dissipate heat. In examples, laser direct structuring (LDS) may be used to form or more through silicon vias (TSVs) or through-chip vias. In examples, the ordered polymer sheets may be extruded via a roll-to-roll process, stacked, and processed to form a laminate interposer structure that makes up the interposer. In examples, the thermoplastic interposer may be used in multi-layer structures interconnecting two or more board assemblies such as printed circuit boards (PCB)s.

20 Claims, 10 Drawing Sheets

(56) References Cited

U.S. PATENT DOCUMENTS

| | | | | |
|---|---|---|---|---|
| 7,286,365 | B2 * | 10/2007 | Sarno | H05K 7/142<br>361/689 |
| 10,105,880 | B2 | 10/2018 | Mathur et al. | |
| 10,342,131 | B1 * | 7/2019 | Kim | H04M 1/02 |
| 11,317,512 | B2 * | 4/2022 | Ha | H05K 1/142 |
| 11,825,639 | B2 * | 11/2023 | Yun | H04M 1/0277 |
| 2001/0046129 | A1 * | 11/2001 | Broglia | H05K 1/141<br>361/803 |
| 2009/0133911 | A1 | 5/2009 | Kuki et al. | |
| 2012/0162928 | A1 * | 6/2012 | Das | H10W 90/401<br>361/728 |
| 2012/0243195 | A1 * | 9/2012 | Lim | H05K 1/141<br>361/784 |
| 2015/0287672 | A1 * | 10/2015 | Yazdani | H10W 40/47<br>257/774 |
| 2019/0082536 | A1 * | 3/2019 | Park | G06F 1/1626 |
| 2021/0014970 | A1 * | 1/2021 | Ha | H05K 1/142 |
| 2021/0099560 | A1 * | 4/2021 | Kim | H04M 1/0274 |
| 2022/0418108 | A1 * | 12/2022 | Chung | H04M 1/0277 |

* cited by examiner 100
202b
202a
108
120
114

100
112
202b
202a
120
116

100
116
104
128
116

136
100
116
104'
116
126'
126"
128
104"

136

THERMOPLASTIC INTERPOSER

CROSS-REFERENCE TO RELATED APPLICATIONS

This application claims priority to U.S. Provisional Application No. 63/414,804, filed Oct. 10, 2022, which is incorporated herein by reference.

BACKGROUND

Electronic devices generally include one or more boards and/or flexible circuits. Printed Circuit Boards (PCB) are often employed to mechanically support and electrically connect components. One or more conductive tracks, traces, pads and other features may be used to make the electrical connections. A PCB may include one or more sheets or layers of metal, such as copper, laminated onto and/or between sheet layers of a non-conductive substrate. There are different types of PCB used in the industry. For examples, a PCB can be a single layer PCB that has a single layer of conductive material only one side of the substrate, a double layer PCB that includes a layer of conductive material on both sides of a substrate, a multi-layer PCB with conductive material on both sides of the substrate, and conductive material sandwiched within the substrate, a high density interconnect (HDI) PCB that includes multiple conductive layers, laser drilled micro vias, fine lines and tolerances, and advanced laminate materials, and a high frequency PCB designed to facilitate signals over 1 gigahertz. Flexible circuits, also known as flex circuit boards or flex circuits, are also a type of PCB. Flex circuits typically include a printed circuit board where the board has at least a bendable portion. Flex circuits are often used as flexible, flat conductors or busses in place of cables, wires, or other electrical connectors. To provide structural stability to a computing device, metal frames are often employed. The metal frames, however, tend to be bulky and require sacrificing space in exchange for structural integrity and stability.

Existing designs employing PCBs mounted to metal frames and coupled together with flex circuits tend to result in complicated, messy packaging, tend to be heavy and bulky, and may be incapable of distributing and dissipating heat generated by portable devices with ever increasing performance requirements.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

DETAILED DESCRIPTION

Figure 1A:
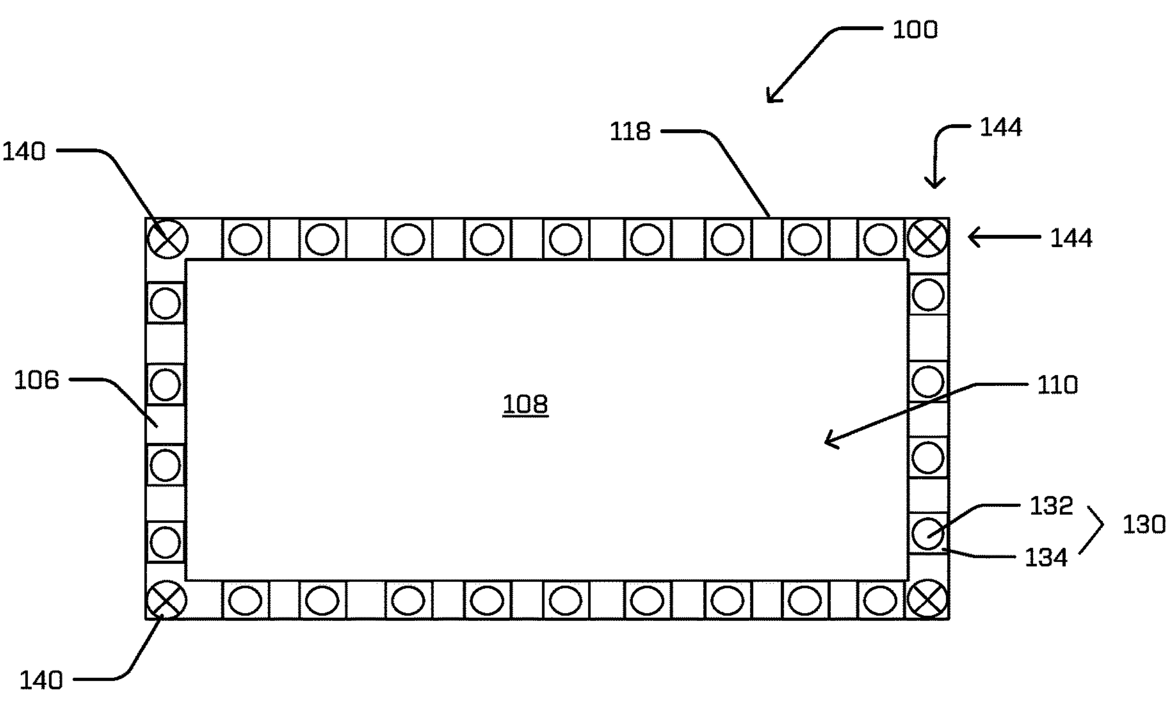
FIGS. 1A and 1B illustrate a diagram of an example of a thermoplastic interposer as described herein.

Disclosed herein is a thermoplastic interposer and method of manufacturing the same. In examples, the interposer as described may act as a heat spreader. In examples, the interposer may include an ordered polymer. In examples, the interposer may include a high molecular weight or ultra-high molecular weight polymer. In examples, the polymer may include polyethylene. In examples, the interposer may include one or more interconnections and/or I/O connections.

In examples, a method of forming a thermoplastic interposer may include an extrusion process. In examples, the method of forming a thermoplastic interposer may include laminating two or more layers of ordered polymer to form a laminate interposer structure. In examples, one or more through vias may be formed in the interposer structure. In examples, the one or more vias may be metallized.

In examples, the process may involve forming a multilayer stack of laminated stretched high molecular weight polyethylene (HMWPE) sheets. In examples, the high molecular weight polymer may include a material other than HMWPE. In examples, the sheets may be stretched. In examples, the stretching may be carried out in a stretching unit. In examples, the stretching of the sheets may result in a high degree of alignment of the polymer chains that results in improved properties of the material (e.g., higher thermal conductivity, higher strength, increased rigidity, etc.).

In examples, the stretched laminated sheets may have a thickness greater than about 25 μm. In examples, the thickness may be at least 50 μm or at least 100 μm. In examples, the elastic modulus of the sheets may be affected by the stretching and may result in an elastic modulus that is greater than or equal to 60 GPa. In examples, the elastic modulus of one or more of the sheets may be 80 GPa, 100 GPa, or 150 GPa. In examples, the thermal conductivity of a stretched sheet or of a laminate interposer structure made from multiple stretched sheets can be greater than 5 W/mK, for example, 10 W/mK, 25 W/mK, or 50 W/mK.

In examples, multiple sheets of the stretched polymer may be compressed to form a multilayer laminate interposer structure. The compression can be carried out at a temperature greater than 100° C., for example 120° C., 135° C., or 140° C. or more under a pressure of 500 bar, for example 1000 bar to 2000 bar for a period of at least 5 min, and in some examples 20 min, 1 hr, or more.

In examples, the thermoplastic interposer may include one or more extensions or wings such as pigtails or thermal strap extensions to aid heat spreading and/or heat dissipation. In examples, thermal strap extensions may include pig tails. In examples, an extension or wing may be provided by including a sheet of ordered polymer that has different lateral dimension than one or more other sheets of ordered polymers in a laminate interposer structure.

In examples, the description herein provides an example interposer fabrication methodology. In examples, thermoplastic interposers as described may be employed in electronic devices including one or more printed circuit board (PCB) devices. In examples, thermoplastic interposers as described may be provided in augmented reality, artificial reality, virtual reality devices, wrist wearables or other wearable devices, and/or other electronic devices to improve electrical connections and/or improve heat spreading and/or heat dissipation.

In examples, a thermoplastic interposer as described herein may provide at tight pitch high density I/O count. In examples, the pitch may range from about 0.35 mm to about 0.40 mm.

In examples, the thermoplastic interposer as described may function as a heat spreader and/or a heat dissipator or thermal sink. In examples, the interposer may include one or more thermal strap extensions such as pigtails to allow for heat to shuttle to thermal ground. In examples, by acting as a thermal sink, the interposer may help reduce hot spots and alleviate touch temperature.

In examples, implementation of a thermoplastic interposer as described may lead to the elimination of one or more long reflow cycles and thus avoid unnecessary intermetallic compound (IMC) growth.

In examples, a thermoplastic interposer as described may be configured to include a mezzanine element that may provide additional thermal, mechanical and/or electrical provisions.

In examples, a thermoplastic interposer as described may be used in place of a thermoset interposer.

In examples, during formation of the multilayer interposer structure, individual surfaces of individual sheets of the film may be activated (e.g., using laser direct structuring (LDS)) to form electrical interconnects between film layers of the interconnect structures to provide electrical pathways connecting vias together and/or external connectors along a periphery of the laminated structure. In examples, this may allow for improved accuracy of the interconnects. In examples, the LDS may be followed by plating to form plated vias.

In examples, a laminate interposer structure is formed, and vias may be formed around all or a portion of a perimeter of the laminate interposer structure. In examples, the via holes may be formed by one or more of laser cutting, machining, drilling, punching, or other mechanical processes. In examples, the vias may be filled with a conductive material by one or more processes, such as laser direct structuring (LDS), mechanical placement of conductive metal plugs (e.g. copper, silver, etc.), conductive epoxy (e.g., silver adhesive epoxy) that may then be cured, compressed mold UHMWPE resin with silver concentrations greater than 20 wt/wt (e.g., 40 wt/wt, 60 wt/wt, etc.) or any combination thereof.

In examples, a stack-PCB may include a midplane architecture. In examples, a core frame may be employed to provide support. In examples, the core frame may be a frame, a heat spreader such as a vapor chamber or heat pipe, or a combination thereof. In examples, one or more the stack-PCB may include one or more electronic devices on one or both sides of the core frame.

In examples, the one or more electronic devices may include one or more board assemblies such as PCBs, complementary elements, or a combination of both. In examples, two or more board assemblies may be interconnected by a thermoplastic interposer described herein.

In examples, heat generated by one or more components of the electronic devices may be distributed and/or exhausted via one or more thermoplastic interposers as described herein. In examples, additional heat may be spread and/or transferred uniformly through the device by a heat spreader provided as the support structure. In examples, by distributing heat throughout the device it may be possible to avoid temperature differentials (or hot spots). In examples, by transferring heat to one or more heat sinks, it may be possible to dissipate more heat from an exterior of the device. In examples, one or more of these heat management systems may allow for higher performance processors, displays, and other heat generating components to be used, for longer periods of time, and/or at lower temperatures.

In examples, one or more complementary elements may include one or more PCBs. In examples, one or more complementary elements may include non-PCB components. In examples, the one or more complementary elements on the second side of the core frame may include sensor boards (including, for example, cameras, image sensors, microphones, temperature sensors, time of flight sensors, etc.), optics boards (including, for example, display screens, projectors, display drivers, etc.), inertia boards (including, for example, inertial sensors such as accelerometers or gyros, magnetometers, etc.), and/or radio frequency boards (e.g., including, for example, one or more radio frequency modules, radios, antennas, etc.).

In examples, an interposer may include a laminate structure may include two or more thermoplastic ordered polymer layers; one or more connection points, each connection point may include a through chip via; and an internal region relative to an outer boundary of the laminate structure.

In examples, the laminate structure further may include a mezzanine element aligned with the internal region. In examples, the mezzanine element may be thinner than a peripheral portion of the laminate structure.

In examples, the laminate structure may include an opening at the internal region.

In examples, the interposer may include a metal plating over at least each connection point.

In examples, the interposer may include an extension protruding from one or more sides of the laminate structure. In examples, the extension may be thermally coupled to the laminate structure.

In examples, each thermoplastic ordered polymer layer may include a high molecular weight polymer.

In examples, each thermoplastic ordered polymer layer may include high molecular weight polyethylene.

In examples, the one or more connection points may be an ultra-high molecular weight polyethylene.

In examples, a tri-layer structure may include a first printed circuit board; a second printed circuit board; and a thermoplastic interposer may include one or more sheets of ordered polymers, the thermoplastic interposer being positioned between the first printed circuit board and the second printed circuit board and coupled to the first printed circuit board and to the second printed circuit board.

In examples, the thermoplastic interposer further may include a mezzanine element within an internal region of a laminate interposer structure. In examples, at least one of the first printed circuit board and second circuit board may include one or more electronic components thermally coupled to the thermoplastic interposer.

In examples, the tri-layer structure may include an extension protruding from a side of the thermoplastic interposer.

In examples, a stack-PCB architecture may include a core frame; two or more printed circuit boards on a first side of the core frame, the two or more printed circuit boards interconnected by one or more first interposers; and two or more complementary elements on second side of the core frame, the second side of the core frame being opposite the first side of the core frame, the two or more complementary elements interconnected by one or more second interposers, wherein at least one of the first interposers or second interposers may include a thermoplastic interposer may include a laminate structure of two or more ordered polymer sheets.

In examples, the core frame further may include a heat spreader.

In examples, the thermoplastic interposer further may include an extension protruding from an outer boundary of the laminate structure.

In examples, a method of forming a thermoplastic interposer may include forming and stretching one or more thermoplastic polymer sheets a using a roll-to-roll process to result in one or more ordered thermoplastic polymer sheets; and laminating the one or more ordered thermoplastic polymer sheets to form a laminate interposer structure.

In examples, the method may include forming one or more connection points on the one or more ordered thermoplastic polymer sheets either before or after the forming of the laminate interposer structure.

In examples, forming one or more traces using LDS processing.

In examples, further may include cutting at least a first sheet of ordered thermoplastic polymer sheets to have at least a portion protruding farther in a first direction than at least a second sheet of ordered thermoplastic polymer sheets.

In examples, the one or more PCBs and/or one or more complementary elements may be arranged on a first side and second side of a core frame provided in a PCB-stack architecture.

Any of the boards described as being on the first side may be located on the second side and vice versa. In some examples, components of multiple different types of boards may be combined with one another (e.g., any one or more of the boards may include RF components, sensors, inertial measurement components, optics components, and/or system components). The stack-PCB architecture may include multiple layers (e.g., two, three, four, or more layers) of boards. The number of layers provided on the first side of the core frame may be the same as or different than the number of layers on the second side of the core frame. In examples, a stack-PCB architecture as described may include a tri-layer structure on the first side of the core frame and the one or more complementary elements on the second side of the core frame may provide the same (e.g., three) or different number (e.g., one, two, four, etc.) of layers on the second side of the core frame as there are on the first side of the core frame.

In examples, one or more thermoplastic interposers as described herein may be provided between two stacked printed circuit boards, between a printed circuit board and a complementary element, and/or between two complementary elements. In examples, a thermoplastic interposer as described herein may provide a communication link between the respective layers of the stack-PCB system. The use of a thermoplastic interposer may reduce or eliminate connector count. In examples, a thermoplastic interposer may allow for an increased I/O count; thus, enabling more processing power in smaller space/volume because of the higher volumetric efficiency. In examples, thermoplastic interposer(s) may also further spread and/or dissipate heat.

In examples, a stack-PCB architecture as described may provide a higher volumetric efficiency. In examples, the stack-PCB architecture may provide more processing power in a compact space and/or volume, allowing devices employing the stack-PCB arrangement according to this application to run more computationally intensive programs, for longer periods of time, and/or to operate at lower temperatures. In examples, the stack-PCB may provide a higher input/output count when compared to standard arrangements, allowing devices employing the stack-PCB arrangement according to this application to connect to more sensors or other components and/or to enable higher and/or higher bandwidth communications.

In examples, employment of a thermoplastic interposer as described may result in improved thermal architecture and/or decreased junction temperatures.

In examples a stack-PCB architecture including one or more thermoplastic interposers may exhibit improved rigidity. In examples, the combination of the stack-PCB architecture as described herein with one or more boards connected by one or more thermoplastic interposers may form a truss-like structure in which the various components are organized so that the whole assemblage can behave as a single object able to exhibit sufficient structural integrity and rigidity to provide a stable configuration. In examples, greater rigidity may lead to elevated mechanical frequencies and thus reduce or mitigate solder fatigue and/or fracture. In examples, the improved structural integrity provided by the combination of a stack-PCB architecture may lead to a more compact and/or light weight design particularly suitable for smaller computing devices such as wearable devices.

In examples, a stack-PCB architecture as described may simplify testing. In examples, the multi-board system can result in a more compact assembly with a smaller bill of material (BOM). This in turn may decrease challenges with design for manufacture and design for excellence. In examples, the stack-PCB architecture as described may include a design that may be readily scalable.

Product design traditionally uses discrete multi-layer boards and flexible circuits to enable design. The connection between the boards can typically be made via connector and specific terminations as design and logistics dictate. This arrangement, however, often may lead to messy packaging as well as testing and debug challenges. These types of manufacturing inefficiencies can raise numerous issues. Moreover, the traditional packaging approach may have an adverse impact on thermal design, spatial optimization, and form factor. For example, the traditional packaging can impede air flow, it may lead to higher pressure drop, and/or may increase decibel noise level.

In examples, the disclosed stack-PCB architecture may be employed in any computing device. In examples, the disclosed stack-PCB architecture may be employed in portable computing devices such as wearable devices, extended reality computing devices such as headsets or glasses, mobile phones, handheld computers, gaming devices, cameras, laptops, or other portable computing devices. For purposes of this description a portable computing device refers to a computing device that a person of average size and strength can carry with one hand. In examples, the disclosed stack-PCB architecture may be employed in non-portable computing devices such as desktop computers, appliances, integrated computing components and the like.

Figure 1B:
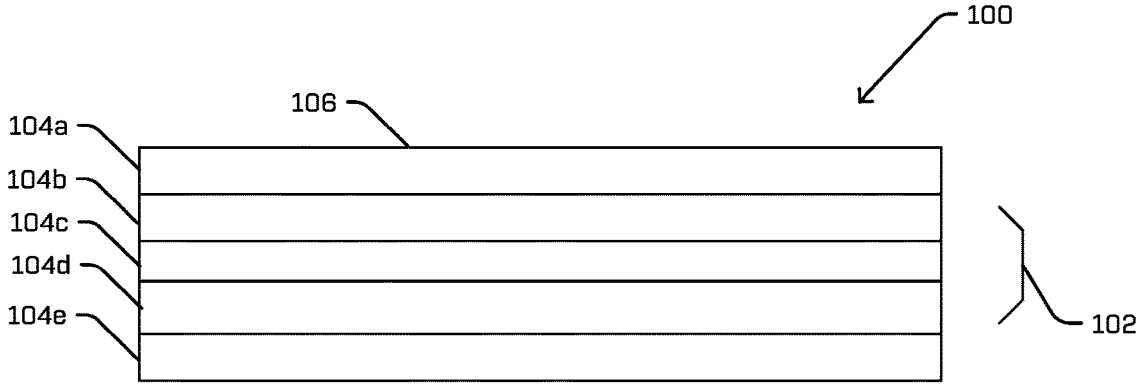

FIGS. 1A and 1B respectively illustrate an example top-down view and an example side view of a thermoplastic interposer 100 in accordance with the description herein. In examples, a thermoplastic interposer 100 may include a single layer of polymer. In examples, a thermoplastic interposer 100 may include a laminate interposer structure 102 including at least two laminated polymer sheets or layers. In examples, a thermoplastic interposer 100 and/or laminate interposer structure 102 may include at least 2, 3, 4, 5, 6, 7, or 8 laminated sheets or layers of polymer. In examples, a thermoplastic interposer 100 and/or laminate interposer structure 102 may have more than 8 laminated sheets or layers of polymer. In examples, the laminated polymer sheets or layers may include laminated ordered polymer sheets or layers. In examples, the laminated polymer sheets or layers may include laminated thermoplastic polymer sheets or layers. In examples, the laminated polymer sheets or layers may include laminated ordered thermoplastic polymer sheets or layers.

In examples, a thermoplastic interposer 100 may include one or more connection points 130. A connection point 130 may include through silicon vias (TSVs) or through-chip vias 132 and, optionally, a pad and/or a trace 134. In examples, a thermoplastic interposer 100 may also include one or more openings 140 to allow insertion of one or more fasteners 222 configured to secure the thermoplastic interposer to one or more board assemblies as described in more detail below and as shown in FIGS. 4B and 5A.

In examples, a thermoplastic interposer 100 may include a laminate interposer structure 102. In examples, the laminate interposer structure 102 may include two or more laminated ordered polymer sheets 104 (e.g., 104*a*, 104*b*, 104*c*, 104*d*, 104*e*, etc. . . . ) In examples, the one or more ordered polymer sheets 104 may include extruded polymer sheets. In examples, the one or more ordered polymer sheets 104 may include a high molecular weight polymer. For purposes of this description, “high molecular weight” refers to a molecular weight that is about 500,000 g/mol or higher. In examples, the high molecular weight may be at least 500,000 g/mol, 1,000,000 g/mol, 5,000,000 g/mol, or 8,000,000 g/mol. In examples, at least one ordered polymer sheet 104 may include polyethylene. In examples, the polyethylene may be a high molecular weight polyethylene (HWMWPE). In examples, an ordered polymer sheet 104 may include a high molecular weight polymer other than HMWPE. In examples, a thermoplastic interposer 100 and/or a laminate interposer structure 102 may include at least one layer including HMWPE. In examples, a thermoplastic interposer 100 and/or a laminate interposer structure 102 may include at least one layer including HMWPE and at least one layer of a polymer other than HMWPE. In examples, a thermoplastic interposer 100 and/or a laminate interposer structure 102 may be free of HMWPE.

In examples, a thermoplastic interposer 100 may include a surface 106 and an opening 108 in an internal region 110 thereof. In examples, an internal region 110 of a thermoplastic interposer 100 may refer to an area that is within but does not extend to outer boundary 120 of thermoplastic interposer 100. In examples, opening 108 may extend across the full thickness or depth dimension of thermoplastic interposer 100. In examples, thermoplastic interposer 100 includes a laminate interposer structure 102 and an opening 108 may extend through at least a portion of the full thickness or depth dimension of the laminate interposer structure 102. In examples, thermoplastic interposer 100 includes a laminate interposer structure 102 and an opening 108 may extend through the full thickness or depth dimension of the laminate interposer structure 102. In examples, thermoplastic interposer 100 and/or laminate interposer structure 102 and/or opening 108 may have a depth of about 1 mm to about 1.5 mm.

Figures 2A, 2B:
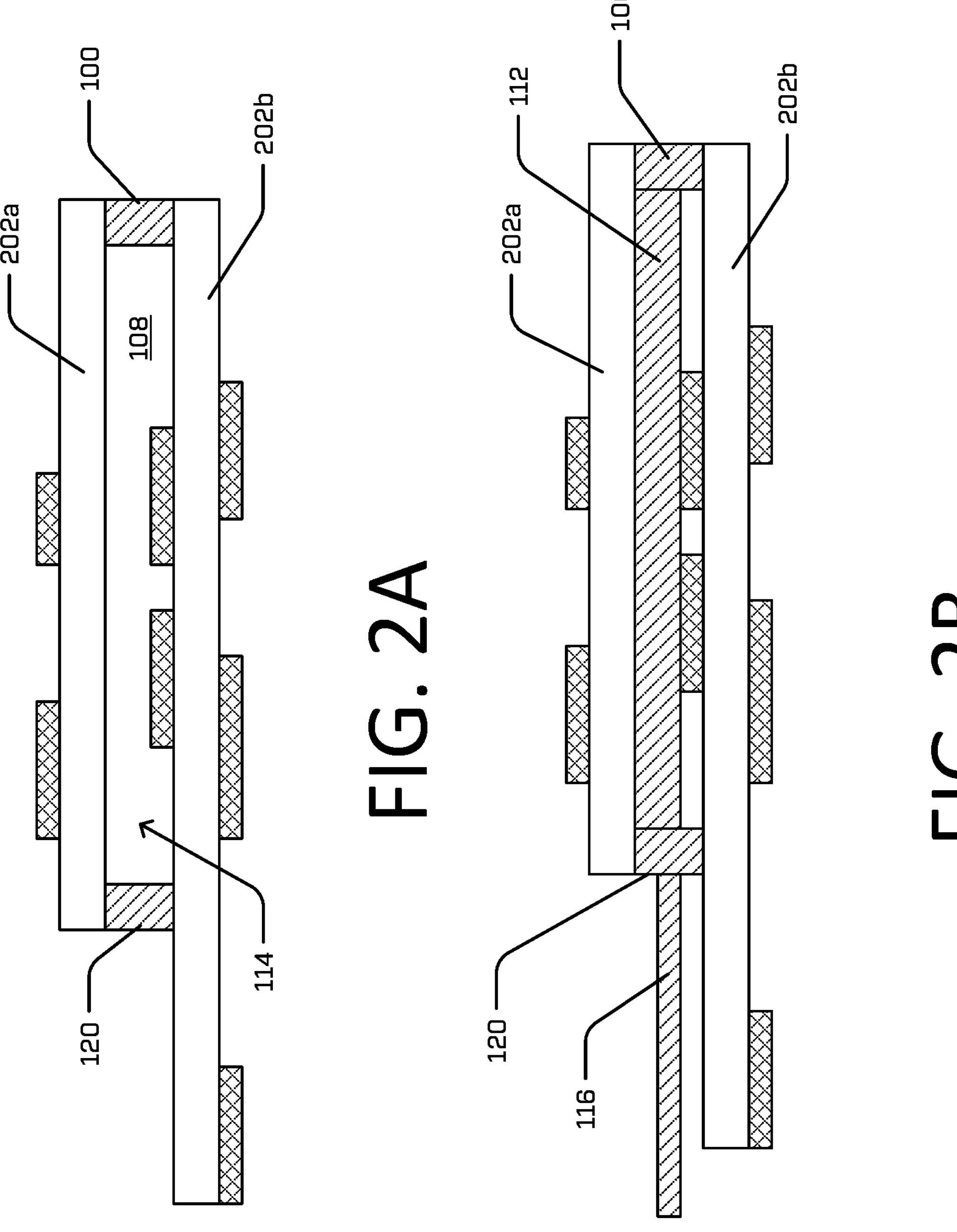
FIGS. 2A and 2B illustrate a tri-layer structure in which a thermoplastic interposer as described herein is provided to interconnect two board assemblies.

FIGS. 2A and 2B illustrate examples of a thermoplastic interposer 100 provided between two board assemblies 202 such as printed circuit boards and/or other circuit board. In examples, opening 108 may allow for accommodation of one or more electronic components 204 provided on one or more board assemblies 202. In examples, a board assembly 202 may include a printed circuit board (PCB) and/or other circuit board that is connected or is to be connected to thermoplastic interposer 100.

FIGS. 2A and 2B illustrate side views of two board assemblies 202*a* and 202*b*, and of a thermoplastic interposer 100. In examples, a thermoplastic interposer 100 as described herein may be employed in a tri-layer structure between two board elements or assemblies. In examples, board assemblies 202*a* and 202*b* can be any board electronic structure. For examples, board assemblies 202*a* and 202*b* can each independently be a PCB or a complementary element as described later. In examples, board assemblies 202*a* and 202*b* may include two PCBs of any type, two complementary elements of any type, or a combination of a PCB and a complementary element. In examples, thermoplastic interposer 100 may be positioned in parallel between the two PCBs as also illustrated later in FIGS. 5A and 5B. In examples, a PCB may include any type of PCB. Also, the same arrangement of thermoplastic interposer 100 may be provided between two complementary elements as shown in FIGS. 5A and 5B. All description provided with reference to FIGS. 1A-5B is equally applicable to an arrangement where thermoplastic interposer 100 is provided between two PCBs, two complementary elements, and/or between a complementary element and a PCB. In examples, board assembly 202*a* may include an MLB PCB and board assembly 202*b* may include an RF board with thermoplastic interposer 100 interconnecting them.

In examples, a thermoplastic interposer 100 may include a mezzanine element 112 located in and/or extending across an internal region 110. In examples, a mezzanine element 112 may be a portion of one or more ordered thermoplastic polymer sheets that make up thermoplastic interposer 100. In examples, a mezzanine element 112 may be a portion of a laminate interposer structure 102. In examples, at an internal region 110 a portion of one or more first ordered thermoplastic polymer sheets may be removed, while at internal region 110 of one or more second ordered thermoplastic polymer sheets may be left in place to form a mezzanine element 112. In examples, at an internal region 110 a thermoplastic interposer 100 may be contoured via etching, ablating, embossing, laminating features or structures on the surface of internal region 110, or other means, to form a mezzanine element 112 configured to provide sufficient space to accommodate one or more electronic components 204 provided on one or more board assemblies 202 connected and/or to be connected to thermoplastic interposer 100. In examples, where an internal region 110 of a thermoplastic interposer 100 is contoured, the thermoplastic interposer 100 may include a single layer structure or a laminate interposer structure 102. In examples, the contouring may be performed on a first side of thermoplastic interposer 100 configured to face a first board assembly 202*a* when thermoplastic interposer 100 is connected to first board assembly 202*a*, a second side of thermoplastic interposer 100 configured to face a second board assembly 202*b* when thermoplastic interposer 100 is connected to second board assembly 202*b*, or both on the first side and the second side of thermoplastic interposer 100.

In examples, the thickness of the mezzanine element 112 is less than the thickness of thermoplastic interposer 100. In examples, the mezzanine element 112 may be thinner than at least a peripheral portion 144 of the laminate interposer structure 102. In examples, mezzanine element 112 may have a thickness that is below 1 mm but greater than zero. In examples, mezzanine element 112 may have a thickness that is about half the depth of thermoplastic interposer 100. In examples, mezzanine element 112 may have a thickness that is about 0.5 mm.

In examples, mezzanine element 112 may be configured to spread heat from the one or more electronic components 204 located on one or more board assemblies 202. In examples, a mezzanine element 112 may be provided in a mezzanine area 114 of thermoplastic interposer 100. In examples, a mezzanine element 112 may include a sheet or layer of high dielectric constant (K) crystalline polymer. In examples, a high K crystalline polymer may include a high molecular weight polymer. In examples, a high K crystalline polymer may include HMWPE. In examples, a high K crystalline polymer may include an ordered HMWPE.

In examples, a thermoplastic interposer 100 may include one or more extensions or wings 116. In examples, an extension or wing 116 may extend from one or more sides of thermoplastic interposer 100 and/or laminate interposer structure 102. In examples, an extension or wing 116 is thermally coupled to one or more sides of thermoplastic interposer 100 and/or laminate interposer structure 102. In examples, an extension or wing 116 may have a thickness that is less than the thickness of thermoplastic interposer 100 and/or laminate interposer structure 102 and greater than zero.

Figures 3A, 3B, 3C:
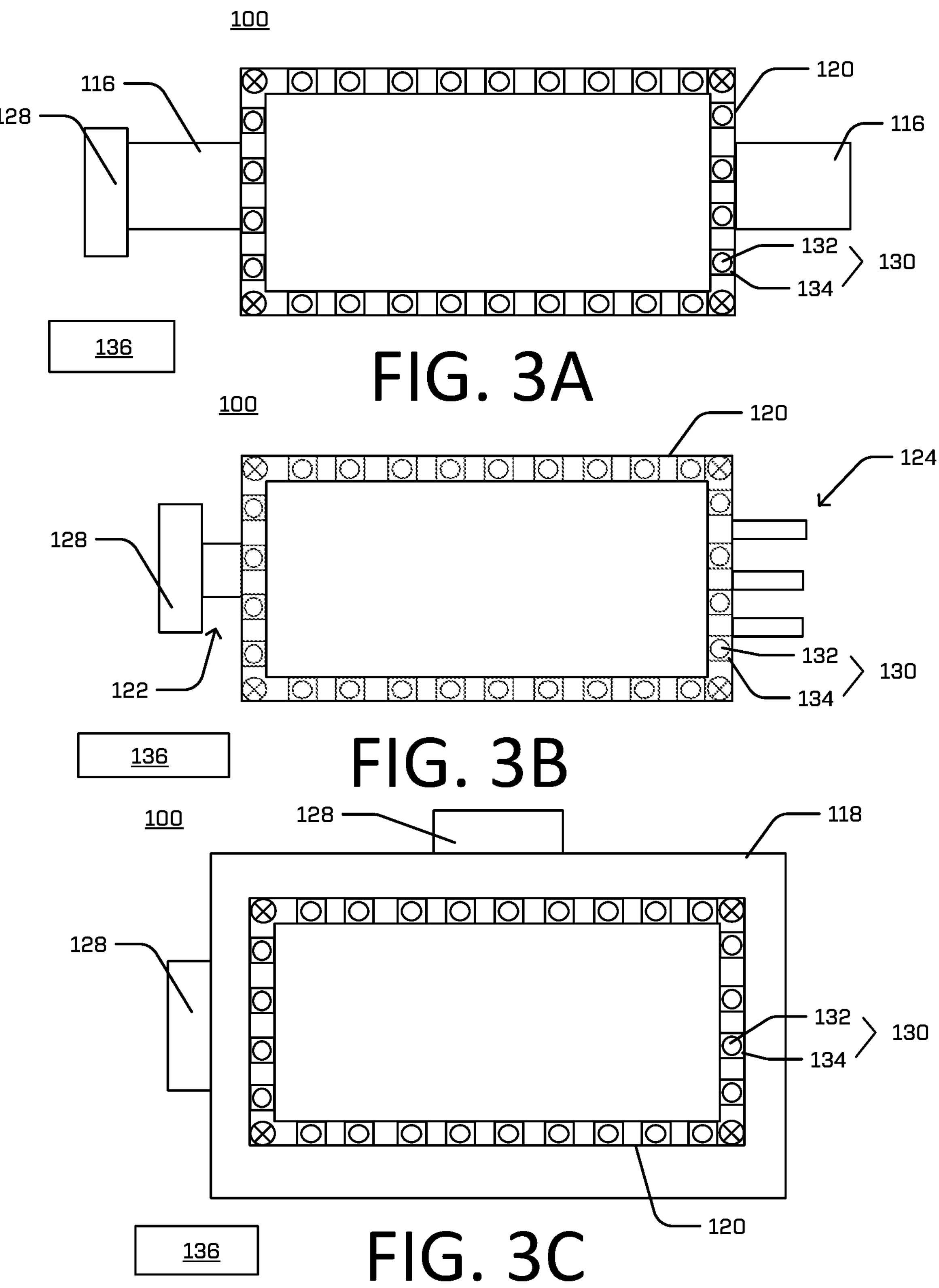
FIGS. 3A-3C illustrate top-down views of example thermoplastic interposers with one or more extensions or wings.

In examples, as shown in top-down views of FIGS. 3A and 3B an extension or wing 116 may include a thermal strap or one or more pigtails that extends from one or more sides of thermoplastic interposer 100 and/or laminate interposer structure 102. In examples, as shown in FIG. 3C, an extension or wing 116 may include a peripheral skirt 118. In examples, a peripheral skirt 118 may be formed in a similar manner as thermal strap or one or more pigtails except that it may extend out continuously along the full perimeter of thermoplastic interposer 100. In examples, although illustrated in regular shape, peripheral skirt 118 may have any desired shape and extend either uniformly or at varying lengths from the periphery of thermoplastic interposer 100 and/or laminate interposer structure 102.

In examples, an extension or wing 116 may extend from an outer boundary 120 of thermoplastic interposer 100 and/or laminate interposer structure 102. In examples, extension or wing 116 in the form of a thermal strap or a pigtail may be a single protrusion as shown by 122 or a group of protrusions as shown by 124 from one or more sides of thermoplastic interposer 100 and/or laminate interposer structure 102. In examples, two or more protrusions 124 may also be coplanar or on different planes.

In examples, an extension or wing 116 may be formed of one or more layers either connected to, thermally coupled to, and/or extending from thermoplastic interposer 100 and/or laminate interposer structure 102 as also described with reference to an extension or wing 116.

In examples, a thermoplastic interposer 100 may have two or more extensions or wings 116 that are connected or separate from each other. In examples, a thermoplastic interposer 100 may include two or more extensions or wings 116 protruding from one or more sides of the outer boundary 120 wherein the two or more extensions or wings 116 are formed or include a contiguous layer or laminate structure. In examples, a thermoplastic interposer 100 may include two or more extensions or wings 116 protruding from one or more sides of the outer boundary 120 wherein the two or more extensions or wings 116 are formed or include separate and independent layers or laminate structures, wherein the two or more extensions or wings 116 are disconnected from each other than for their connection to thermoplastic interposer 100.

Figures 3D, 3E:
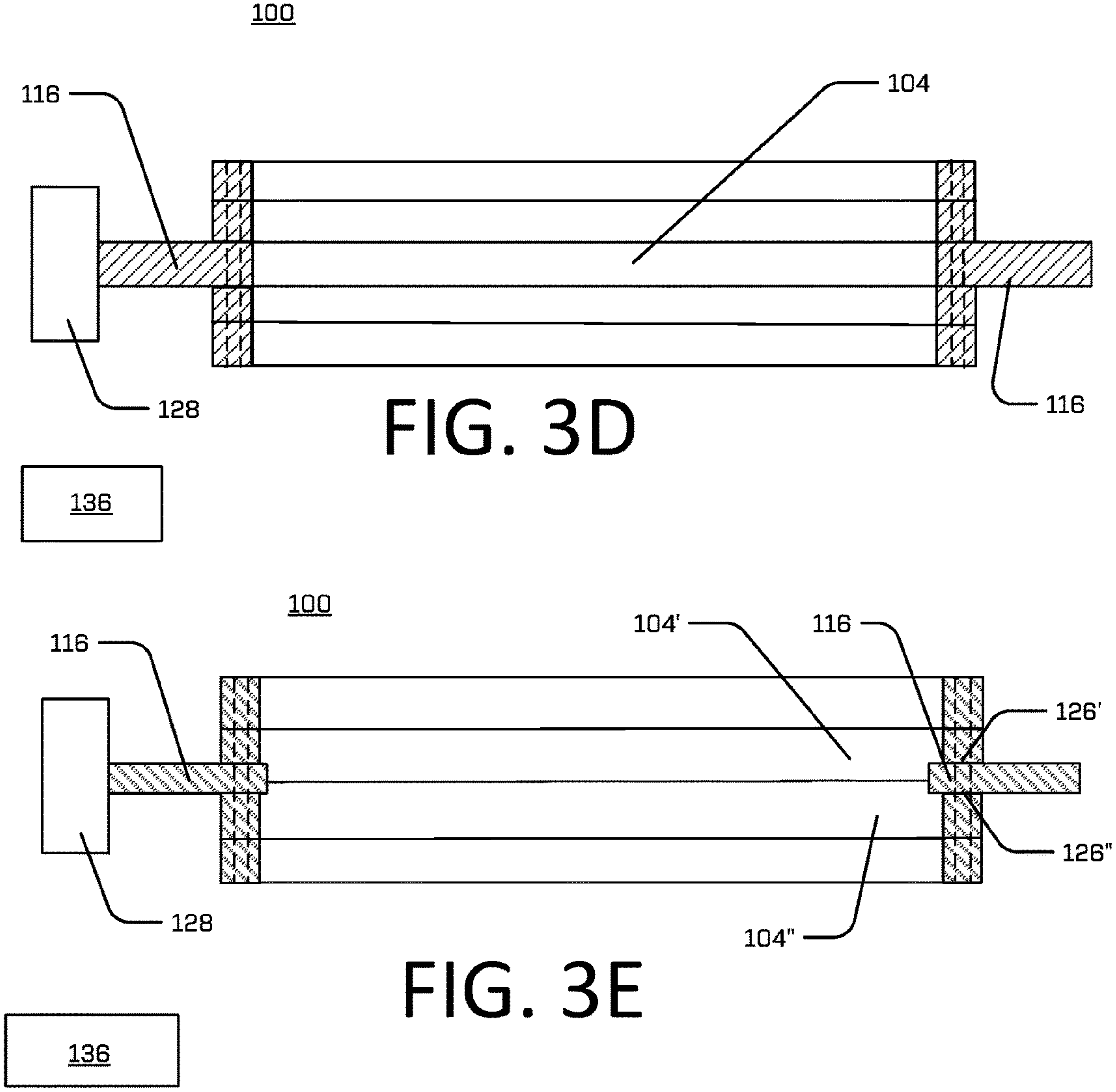
FIGS. 3D and 3E illustrate side views of example thermoplastic interposers with one or more extensions or wings.

In examples, as shown in FIG. 3D, an extension or wing 116 may be formed by one or more layers extending from thermoplastic interposer 100. In examples, an extension or wing 116 may be formed of one or more polymer sheets that form thermoplastic interposer 100. In examples, an extension or wing 116 may be formed by at least one polymer sheet 104 of a laminate interposer structure 102. In examples, an extension or wing 116 may have the same or different width as the thermoplastic interposer 100 and/or one or more other polymer sheets 104 that are included in a laminate interposer structure 102. In examples, an extension or wing 116 has a width that is narrower than the width of the thermoplastic interposer 100.

In examples, an extension or wing 116 may be formed by a material that is different from a polymer sheet 104 of a laminate interposer structure 102. In examples, an extension or wing 116 may include one or more metals (e.g., titanium, aluminum, magnesium, steel, or alloys thereof), high strength polymers (such as polyamideimide (PAI), polyetherimide (PEI), polyetheretherketone (PEEK), and/or polyphenylene sulfide (PPS). In examples, an extension or wing 116 may include a flex circuit material, for example Kapton Tape optionally laminated with a metal such a copper. In examples, an extension or wing 116 may be one or more layers of thermally conductive material thermally coupled to thermoplastic interposer 100.

In examples, an extension or wing 116 may be configured to transfer heat to beyond an outer edge of thermoplastic interposer 100. In examples, an extension or wing 116 may be thermally coupled to a heat sink or other heat dissipating structure.

In examples, as shown in FIG. 3E, an extension or wing 116 may extend from between at least a first and second polymer sheets 104' and 104" of a laminate interposer structure 102 that makes up a thermoplastic interposer 100. In examples, an extension or wing 116 may be laminated between a first and second polymer sheets 104' and 104". In examples, an extension or wing 116 may extend over at least a portion of a surface of either a first polymer sheet 104' and/or of a second polymer sheet 104". In examples, a recess may be formed, for example by etching and/or laser ablation, at a surface of the first polymer sheet 104' and/or of second polymer sheet 104" to accommodate for the thickness of an extension or wing 116. In examples, a recess 126' or 126" may be formed respectively at an inner and/or outer surface of first polymer sheet 104' and/or second polymer sheet 104", wherein an outer surface is one that faces away from the other referenced polymer sheet and an inner surface is one that faces the other referenced polymer sheet, i.e. the surface at which the two polymer sheets 104' and 104" are laminated. In examples, not shown, a recess is not provided and a gap or spacing may be formed between a first polymer sheet 104' and a second polymer sheet 104", the gap or spacing being occupied at least in part by a portion of an extension or wing 116.

In examples, an extension or wing 116 may be coupled at a far end outside the outer boundary 120 of thermoplastic interposer 100 to a heat dissipating structure 128. In examples, a heat dissipating structure 128 may include a heat sink. In examples, a heat dissipating structure 128 may include at least a portion of an outer frame of an electronic device in which the thermoplastic interposer 100 and/or the stack-PCT architecture including a thermoplastic interposer 100 may be used. Any combination of various heat dissipating structures 128 may also be employed.

FIG. 3A illustrates an example of a side view of a thermoplastic interposer 100 from a side where no extension or wing 116 is present and shows how an extension or wing 116 from two other sides can extend out from the outer boundary 120 of thermoplastic interposer 100. In examples, an extension or wing 116 may extend out at only one side of thermoplastic interposer 100, or at two or more sides of thermoplastic interposer 100.

As illustrated in FIGS. 1A and 3A-3C, which show example top-down views, a thermoplastic interposer 100 may include connection points 130 configured to be attached to a substrate by through silicon vias (TSVs) or through-chip vias 132. For purposes of this disclosure a TSV or through-chip via refers to a vertical electrical connection that passes completely through a wafer, substrate, or die. In examples, a thermoplastic interposer 100 may include one or more conductive pads and/or traces 134. In examples, a thermoplastic interposer 100 may include one or more TSVs or through-chip vias 132 and one or more conductive pads and/or traces 134.

In examples, the connection points 130 on thermoplastic interposer 100 may be arranged as desired. In examples, connection points 130 may be through silicon vias (TSVs) or through-chip vias 132. In examples, the connection points 130 and/or the one or more through silicon vias (TSVs) or through-chip vias 132 may be provided in the thermoplastic interposer 100 and/or laminate interposer structure 102. In examples, through silicon vias (TSVs) or through-chip vias 132 may be configured to pass through the thermoplastic interposer 100 and/or laminate interposer structure 102. In examples, where one or more extensions or wings 116 are present, one or more through silicon vias (TSVs) or through-chip vias 132 may be formed through the one or more layers of material that also form the one or more extensions or wings 116.

In examples, pads and/or traces 134 may be formed at and/or to extend to the location where TSV or through-chip vias 132 are to be provided. In examples, pads or traces 134 may be metal pads or traces. In examples, pads and/or traces 134 can include any suitable metal such as, for example, copper, aluminum, titanium, silver, or any alloy or combination thereof. In examples, pads and/or traces 134 may be configured to form a Faraday cage. In examples, as illustrated, connection points 130 on thermoplastic interposer 100 may be provided at least along a portion of a surface of a thermoplastic interposer 100. In examples, any arrangement of connection points 130 may be implemented as desired.

In examples, a thermoplastic interposer 100 can be metallized from the top, bottom, and side to connect it to the surrounding components of the system.

In examples, connections between a board assembly 202, such as a PCB or a complementary element, and a thermoplastic interposer 100 may be made via any suitable fashion. In examples, one or more connections between a board assembly 202 and a thermoplastic interposer 100 may include one or more solder bumps as for example illustrated by solder bumps 138 in FIGS. 5A and 5B.

In examples, TSVs or through-chip vias 132 may be formed by any suitable process such as chemical etching, laser, or other means. In examples, a laser cutting may be carried out onto a polymer sheet of the thermoplastic interposer 100 and/or laminate interposer structure 102 to form the vias holes. In examples, one or more laser etching, chemical etching, mechanical etching or any combination thereof may be employed to form one or more vias in an oriented thermoplastic polymer sheet 104 and/or a laminate interposer structure 102. In examples, a via may be metallized to form conductive connection 142 for the TSV or through-chip via 132. In examples, the metallization may include depositing a conductive material, for example a metal, to fill the via and form conductive connection 142. In examples, the metallization may include depositing a conductive material over the internal surface of the via to form conductive connection 142. In examples, a first layer of conductive material may be deposited over the internal surface of a via followed by the deposition of a dielectric material to fill the remaining space of the via. In examples, metallization may include depositing a metal such as copper or other metallic material such as a conductive epoxy to form conductive connections 142 to map the I/Os to the bump pillars on the thermoplastic interposer 100.

In examples, the pads and/or traces 134 may be formed via laser direct structuring (LDS). It has been discovered that addition of an LDS additive to the thermoplastic polymer does not substantially affect its RF response. In examples, a surface treatment may be carried out onto the polymer of the thermoplastic interposer 100 and/or laminate interposer structure 102 to make the metallization process easier. In examples, the surface treatment may include blending a chemical additive in the thermoplastic polymer during the polymer sheet manufacturing. In examples, laser activation can be used to initiate a chemical reaction to form very fine metal particles on the laser-treated surface of the polymer sheets. In examples, laser activation may be carried out using an excimer laser. In examples, in addition to the forming of metal nuclei, a rough surface can also be formed on the laser treated portion of the polymer sheets. In this manner, metal traces such as copper or other metallic materials can be formed onto the treated thermoplastic polymer surface during the metallization process and good adhesion between the deposited metal layer and the thermoplastic polymer can be established. In examples, metallization may follow the surface activation. In examples, metallization may include electroless plating, electroplating, or a combination thereof. In examples, via metallization it may be possible to establish pads and/or metal traces 134 in the thermoplastic polymer. In examples, LDS may also be used to activate an internal surface of a via hole so that connection may be made with one or more pads and/or traces 134 through. In examples, metallization may include depositing a metal such as copper or other metallic material such as a conductive epoxy to form pads and/or traces 134 to map the I/Os to the bump pillars on the thermoplastic interposer 100.

In examples, the metallization is used to form copper connections 142 and/or copper pads and/or traces 134. In examples, the metallization is used to form cured conductive epoxy connections 142 and/or cured conductive epoxy pads and/or traces 134. In examples, a cured conductive epoxy may include a silver adhesive epoxy and/or a compressed mold ultra-high molecular weight polyethylene (UHMWPE) with silver concentration great than 20 wt/wt, for example 40 wt/wt or higher, or 60 wt/wt or higher. In examples, a cured conductive epoxy may include a combination of silver adhesive epoxy and compressed mold UHMWPE.

Figure 4A:
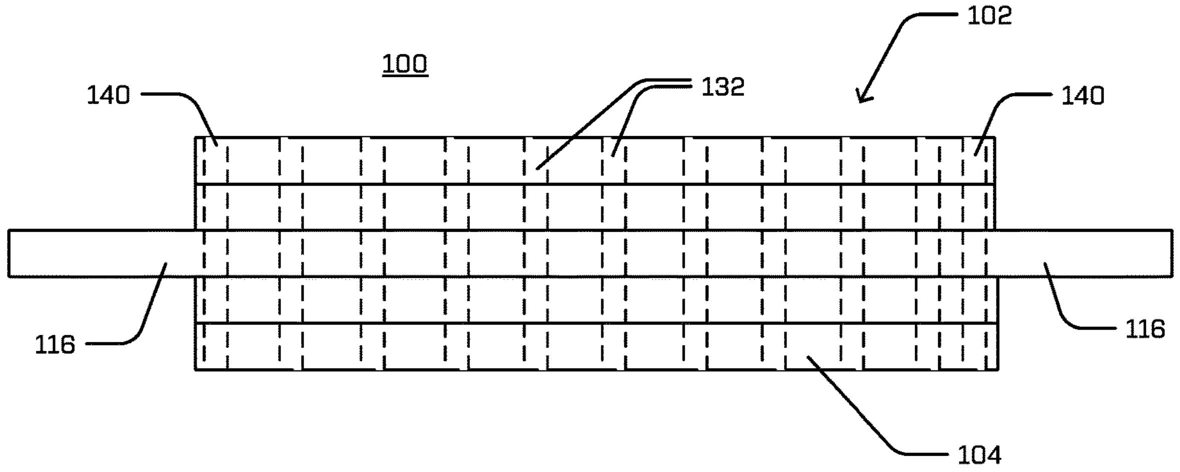
FIG. 4A illustrates a side view of an example thermoplastic interposer with one or more extensions or wings and with through vias identified.
Figure 4B:
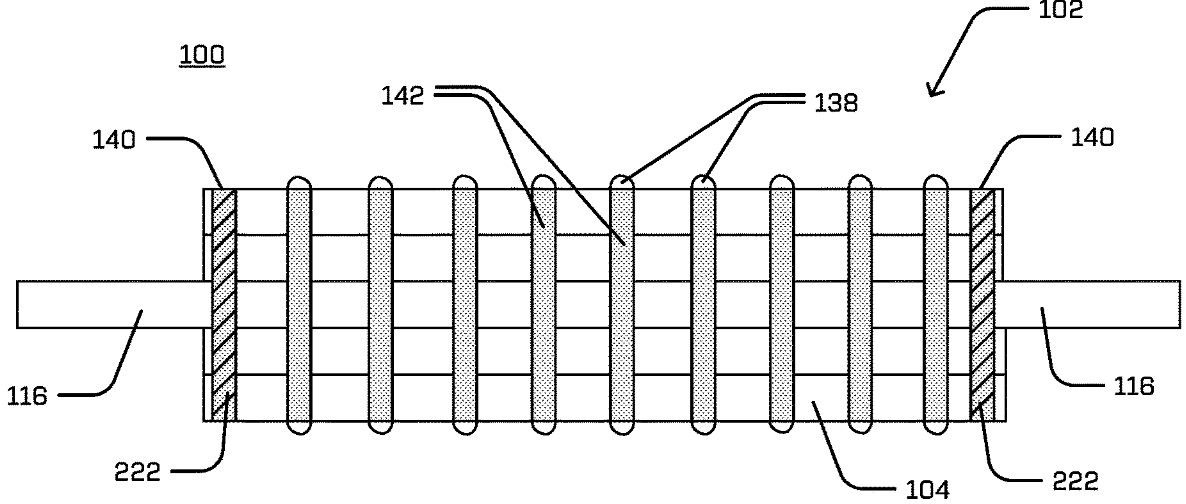
FIG. 4B illustrate a cross-section view of an example thermoplastic interposer in which the through vias have been filled with conductive material to form interconnections.
Figure 5A:
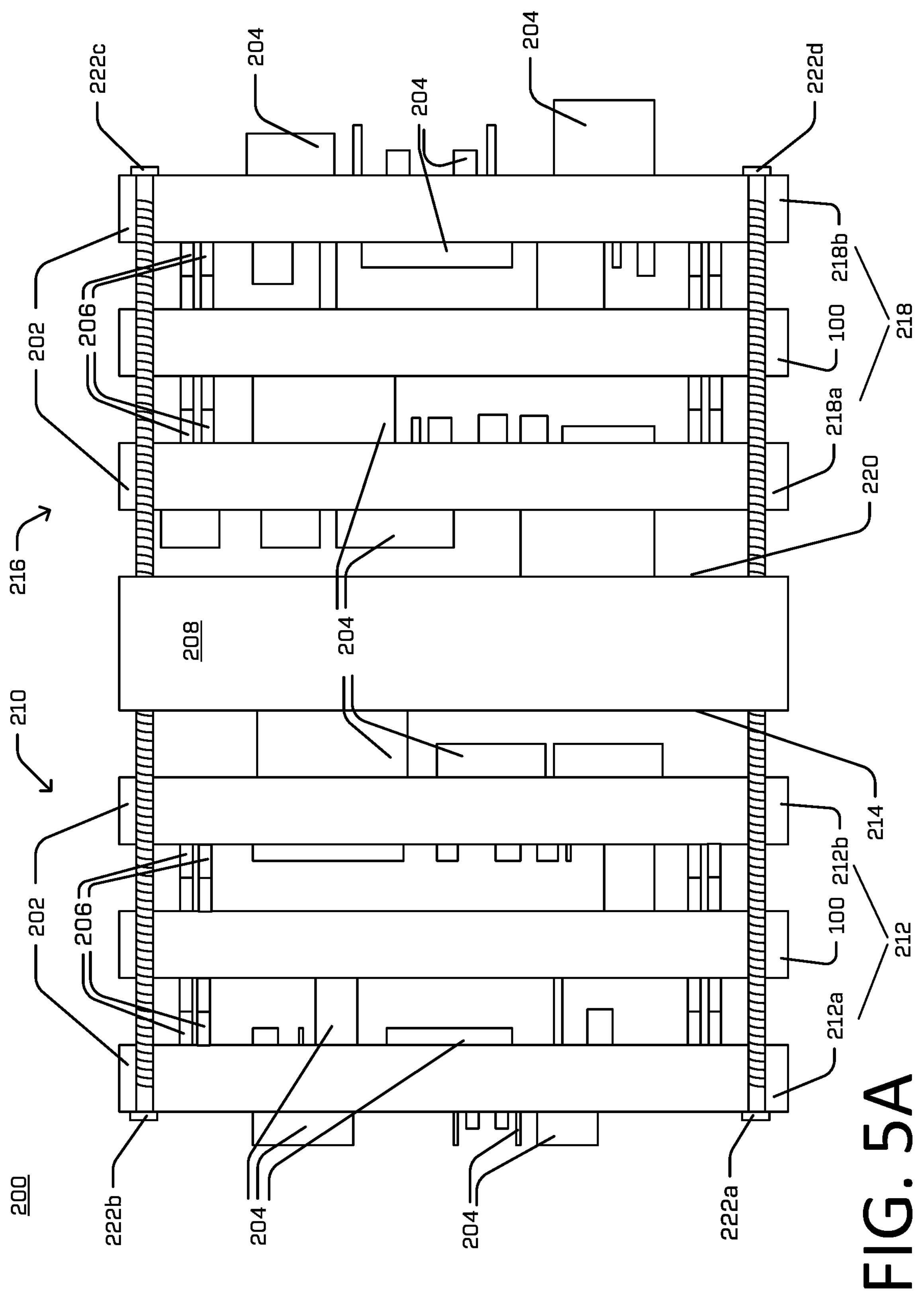
FIG. 5A illustrates an exploded diagram of examples of a stack-PCB architecture including a thermoplastic interposer as described herein.
Figure 5B:
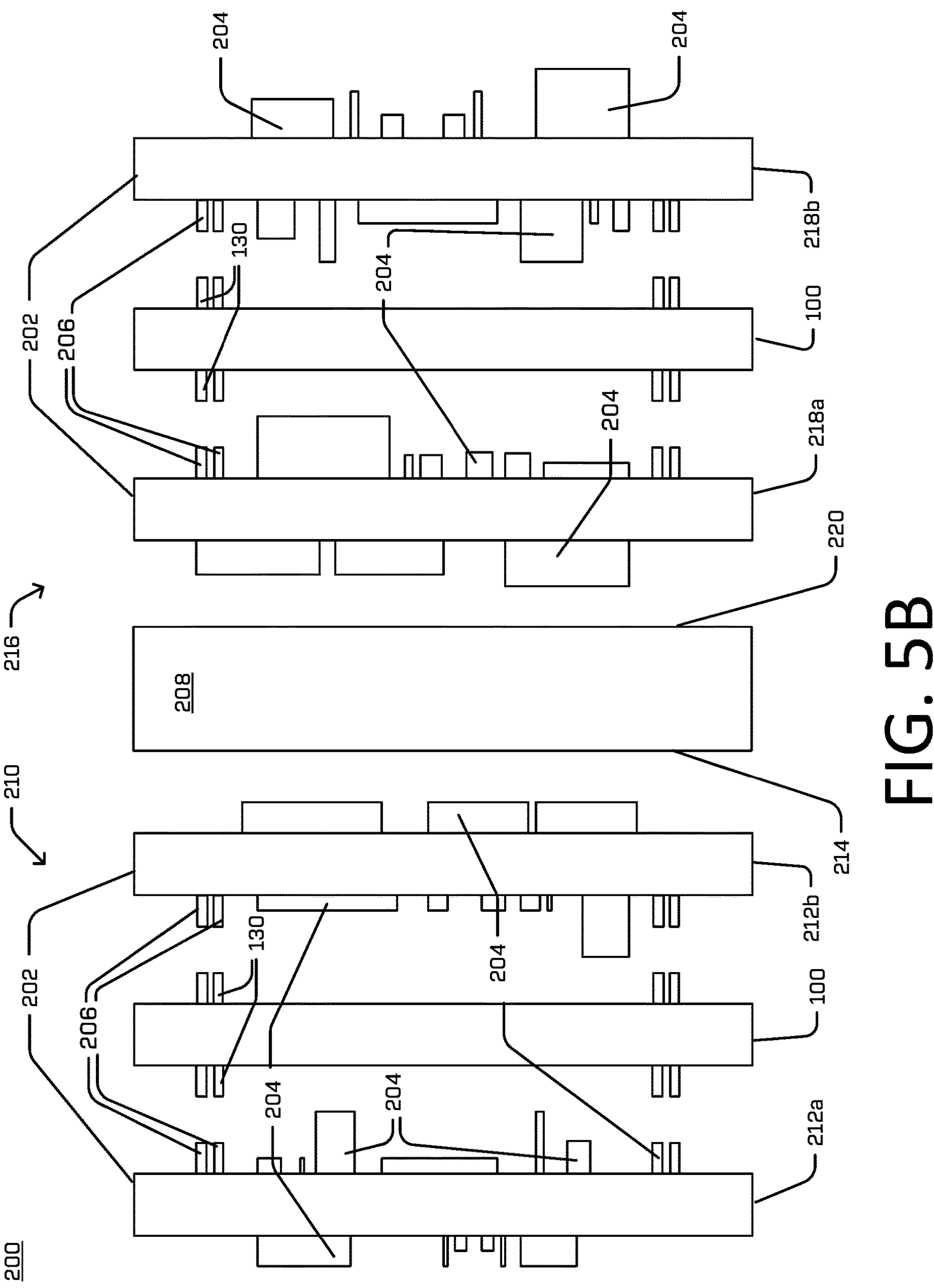
FIG. 5B illustrates an exploded diagram of examples of a stack-PCB architecture including a thermoplastic interposer as described herein.

In examples, as shown in FIGS. 4A and 4B, the TSV or through-chip vias 132 may be formed to extent through thermoplastic interposer 100 and/or laminate interposer structure 102. In examples, after metallization, the TSV or through-chip vias 132 are completed with a metallic material extending the length of the vias formed. In examples, solder bumps or other connecting structures may be provided at opposite ends of the TSV or through-chip vias 132 to enable connection with one or more connection points 206 of one or more board assemblies 202. In examples, the connection between a board assembly 202 and a thermoplastic interposer 100 may include a thermal process such as laser soldering, induction heating, or the like to reflow the solder paste provided at the connection points.

FIGS. 5A and 5B illustrate a cross-section view of examples of a stack-PCB architecture 200 in which one or more tri-layer structures including a thermoplastic interposer 100 as described herein may be employed. The stack-PCB architecture 200 is simply an example implementation for illustrative purposes. A thermoplastic interposer 100 as described herein may be employed in any PCB architecture that includes two or more interconnected board assemblies 202, such as PCBs and/or complementary elements as described.

In examples, as shown in FIGS. 5A and 5B, a board assembly 202 may include one or more connection points 206. In examples, connection points 206 on a board assembly 202 may be provided at a peripheral region of the board assembly 202. In examples, connection points 206 may be provided anywhere on a surface of a board assembly 202. In examples, the size of a surface area of a surface of board assembly 202 facing a thermoplastic interposer 100 may be larger than, smaller than, or the same as the surface area of the surface of that of thermoplastic interposer 100 facing the board assembly 202. In examples, the dimensions of a board assembly 202 may be different from the dimensions of a thermoplastic interposer 100 to which it is connected. In examples, a board assembly 202 may have a peripheral region that extends beyond a peripheral region of a thermoplastic interposer 100 to which it is connected. In examples, where a board assembly 202 has greater dimensions than the thermoplastic interposer 100 to which it is connected, the connection points 206 of the board assembly 202 may be located at an internal surface area of board assembly 202 instead of at peripheral region. In examples, one or more connection points 206 on a board assembly 202 may be arranged so that when coupled to an interposer 100 or other connector, at least some of the one or more connection points 206 on board assembly 202 may align with at least some of the one or more connection points 130 on thermoplastic interposer 100. In examples, one or more connection points 206 on a board assembly 202 may be arranged so that when coupled to a thermoplastic interposer 100, at least some of the one or more connection points 206 on board assembly 202 may be misaligned with at least some of the one or more connection points 130 on thermoplastic interposer 100.

In examples, a stack-PCB architecture 200 may include a core frame 208 with one or more stacks of board assemblies 202. In examples, a board assembly 202 may include a printed circuit board (PCB) 212 or a complementary element 218*a*, 218*b*, etc. (collectively referred to as "complementary elements 218"). In examples, a stack-PCB architecture 200 may include a core frame 208 with a system stack 210 of one or more printed circuit boards (PCBs) 212 (e.g., 212*a*, 212*b*, etc. . . . ) mounted onto at least a first side 214 of the core frame 208 and a complementary stack 216 of one or more complementary elements 218 (e.g., 218*a*, 218*b*, etc. . . . ) mounted onto at least a second side 220 of the core frame 208, wherein one or more interposers 100 may be employed to connect two consecutive PCBs 212, complementary elements 218, or PCB and complementary element. While PCBs 212 and complementary elements 218 are shown and described on opposite sides of core frame 208, this arrangement is only an example. In examples, one or more PCBs 212 and one or more structures used as complementary elements 218 may be located on the same side of core frame 208. In examples, an interposer may offer a wide conduit or bridge for signal transfer while minimizing the distance between printed circuit boards. In examples, this may result in a reduced or minimized resistance and/or capacitance delay. In examples, a thermoplastic interposer 100 may help distribution and/or dissipate heat of stack-PCB architecture 200.

In examples, a stack-PCB architecture 200 may include a system stack 210 including one or more PCBs 212 on a first side 214 of the core frame 208. In examples, a PCB 212 may have any desired design. In examples, a PCB 212 may be a single layer, double layer, or multi-layer printed circuit board, a high-density interconnect (HDI) PCB, and/or a high frequency PCB. In examples, at least one PCB 212 in system stack 210 may include a system on chip printed circuit board. A system on chip printed circuit board may also be referred to as motherboard, mainboard, or logic board. In examples, a system on chip printed circuit board may include a primary central processing unit (CPU) for the computing device of which the stack-PCB architecture is part. In examples, the system on chip printed circuit board may serve to connect the CPU to one or more other parts of a computing device. In examples, a system on chip printed circuit board may connect CPU to memory, one or more hard drives, one or more additional ports and expansion cards, or any combination thereof.

In examples, a PCB 212 may include passive components, active components, or a combination thereof. In examples, one or more PCBs 212 may include electronic components on at least on side. In examples, one or more PCBs 212 may include a multi-layer board (MLB), which may include electronic components on both sides. In examples, one or more PCBs 212 may include one or more functional PCBs. In examples, a functional PCB may also be referred to as daughter card. In examples, a functional PCB may include an interface PCB. An interface PCB may be one that allows interaction with a user and/or with another device. In examples, an interface PCB may allow a computing device to communicate with one or more peripheral devices. In examples, a function PCB may include an RF PCB. In examples, other types of PCBs may be included in place of and/or in addition to an RF board. In examples, an RF board may also be an MLB. In examples, PCBs 212 may include other types of boards such as a logic board, display board, communication board, sensors boards, optic boards, inertia board, or any other board that may be desired for the particular application.

As illustrated the one or more PCBs 212 are shown as coextensive. However, this is only an example. Each one of the one or more PCBs 212 may have any shape or size independent of any other component of the stack-PCB architecture 200. In examples, at least one of the one or more PCBs 212 may have a larger area size than at least one other of the one or more PCBs 212. In examples, a PCB 212 may have a multilateral shape, a circular shape, an oval shape, and may have a regular or irregular shape. In examples, the number of PCBs 212 that may be stacked on the first side 214 of the core frame 208 is not limited. As illustrated in FIGS. 5A and 5B, in examples where two or more PCBs 212 are provided, the PCBs 212 may be arranged parallel to each other, to core frame 208, complementary stack 216, one or more complementary elements 218, or any combination thereof with one or more interposers 100 included therein.

In examples, a stack-PCB architecture 200 may include a complementary stack 216 including one or more complementary elements 218 on a second side 220 of the core frame 208. In examples, the one or more complementary elements 218 may include one or more board or board-like structures. Board-like structure refers to a structure that has a given thickness between two flat surfaces. The peripheral shape of a board or board-like structure is not particularly limited and can be any multilateral shape, circular shape, oval shape, and any regular or irregular shape. In examples, the one or more complementary elements 218 may include the same size and shape as one or more PCBs 212 of system stack 210.

In examples the one or more complementary elements 218 may be arranged to be parallel to core frame 208, system stack 210, and/or one or more PCBs 212. In examples, where two or more complementary elements 218 are present, they may be arranged parallel to each other. In examples, the one or more complementary elements 218 may be mounted to core frame 208.

In examples, one or more complementary elements 218 may include electrically conductive material, electrically insulating material, or a combination thereof. In examples, one or more complementary elements 218 may include passive components, active components, or a combination thereof. In examples, one or more complementary elements 218 may exhibit no functionality.

In examples, the one or more complementary elements 218 may include one or more PCBs. In examples, one or more complementary elements 218 may include a processor. In examples, one or more complementary elements 218 may include combination of a processor and one or more system components such as sensors. In examples, one or more complementary elements 218 may include one or more inertia boards, sensors boards, optic boards, or any combination thereof. In examples, sensors boards may include tracking sensors such as, for example, eye tracking or face tracking, or other sensors such as external sensors, internal sensors, and the like. In examples, one or more electrical connections may be provided between any two complementary elements 218. Electrical connections may be made using a thermoplastic interposer 100 as previously described.

In examples, two or more complementary elements 218 of complementary stack 216 may be interconnected together. In examples, a thermoplastic interposer 100 may be used to connect one complementary element 218*a* to another complementary element 218*b*.

In examples, system stack 210 may include one or more PCBs 212 and/or interposers 100 each forming a layer of system stack 210. Similarly, the complementary stack 216 may include one or more complementary elements 218 and/or interposers 100 each forming a layer of complementary stack 216. In examples, the number of layers of system stack 210 may be the same as the number of layers of complementary stack 216. In examples, the number of layers of system stack 210 may be different from the number of layers of complementary stack 216. In examples, system stack 210 includes at least one PCB 212 and a thermoplastic interposer 100. In examples, a complementary stack 216 includes at least one complementary element 218 and a thermoplastic interposer 100.

As illustrated in FIGS. 2A and 2B, one or more PCBs 212 of system stack 210 and/or one or more complementary elements 218 of complementary stack 216 may include one or more electronic components 204. In examples, one or more electronic components 204 may be present on one or more sides of a PCB 212 and/or complementary element 218. As illustrated in FIGS. 2A and 2B, in examples one or more electronic components 204 may be present on opposite sides of one or more PCBs 212 and/or one or more complementary elements 218. The type and arrangement of one or more electronic components 204 on any one PCB 212 and/or complementary element 218 can be selected based on the desired functionality. In examples, one or more electronic components 204 may include active devices, passive devices, or a combination of both. Passive devices may include resistors, capacitors, inductors, diodes, crystals, relays, and other like structures. Active devices may include transistors, integrated circuits (IC), and other like structures. In examples, one or more PCBs 212 and/or one or more complementary elements 218 may include a ball grid array design to enable the mounting of one or more electronic components 204.

In examples, to ensure that thermal energy is generally distributed across the stack-PCB architecture and ideally isothermal conditions are achieved, the one or more PCBs 212 of system stack 210 and the one or more complementary elements 218 of complementary stack 216 may be configured with one or more electronic components 204 in a manner that distributes the overall load. In examples, heavy load electronic components 204 and/or heavy load arrangements of components 204 may be provided in separate PCBs 212 and/or complementary elements 218. In examples, PCBs 212 and/or complementary elements 218 that carry heavier loads compared to other PCBs 212 and/or complementary elements 218 may be arranged closest to a mezzanine element 112 of a thermoplastic interposer 100.

The different components of the stack-PCB architecture 200 may be fastened together using one or more fasteners 222 (e.g., 222*a*, 222*b*, 222*c*, 222*d*, etc.). Any number of fasteners 222 may be used as desired or as may be necessary. In examples, fasteners 222 may include bolts, screws, pins, or like structures. In examples, fasteners 222 include bolts. In examples, fasteners 222 can be configured to engage core frame 208, one or more PCBs 212, one or more complementary elements 218, or any combination thereof. In examples, fasteners 222 may be configured to additionally engage one or more additional structures provided in the stack-PCB architecture 200. In examples, fasteners 222 may be configured to engage one or more thermoplastic interposers 100. FIGS. 2A and 2B illustrate separate fasteners 222 for the one or more PCBs 212 and for the one or more complementary elements 218. This is only an example. In examples, one or more contiguous fastener 222 may be used to secure one or more PCBs 212 and one or more complementary elements 218 of stack-PCB architecture 200. In examples, provisions may be provided around the perimeter of the core frame 208. For example, the core frame 208 may include one or more threaded studs extending out of plane or through-hole provisions. In examples, a fastener 222 does not traverse the active portion of the core frame 208.

In examples, fasteners 222 may be provided at one or more corners of stack-PCB architecture 200 and/or at one or more central location of stack-PCB architecture 200. For example, one fastener 222 may be provided at each corner and one may be provided at an internal area of stack-PCB architecture 200. Fasteners 222 may be arranged in the symmetrically or asymmetrically about core frame 208. In examples, fasteners 222 may be arranged in a similar manner for complementary stack 216 as for system stack 210. In examples, fasteners 222 may be configured to penetrate through at least a portion of one or more PCBs 212, complementary elements 218, and/or interposers 100.

FIG. 5B illustrates an exploded view of stack-PCB architecture 200 with the fasteners 222 removed. FIGS. 5A and 5B illustrate two PCBs 212*a* and 212*b* in system stack 210, with a single thermoplastic interposer 100 connecting PCBs 212*a* and 212*b*. In examples, system stack 210 may include only a single PCB 212. In examples, system stack 210 may include three or more PCBs 212. In examples where system stack 210 include three or more PCBs 212, one or more interposers 100 may be provided between any two PCBs 212. In examples, system stack 210 includes three or more PCBs, the system stack 210 may include alternating PCBs 212 and interposers 100. Likewise, although FIGS. 5A and 5B illustrate two complementary elements 218 with a single thermoplastic interposer 100 connecting them, this is merely an example as the architecture may include three or more complementary elements 218 with one or more interposers 100 provided between any two complementary elements 218. In examples, complementary stack 216 may include three or more complementary elements 218, the complementary stack 216 may include alternating complementary elements 218 and interposers 100. In examples, every interposer in a stack-PCB architecture may include a thermoplastic interposer 100 as described. In examples, one interposer in a stack-PCB architecture may include a thermoplastic interposer 100 as described. In examples, at least one interposer in a stack-PCB architecture may include a thermoplastic interposer 100 as described.

As illustrated in FIGS. 5A and 5B, by using one or more interposers 100, it may be possible to eliminate flex circuits from the stack-PCB architecture. This may lead to a less cluttered packaging and improved airflow. In examples, the short and more direct connections achievable by one or more interposers 100 may also lead to minimized signal delay and/or signal noise. In examples, one or more thermoplastic interposer 100 as described earlier may be configured to transfer, distribute, and/or diffuse heat and improve heat diffusion across the stack-PCB architecture, and thus may improve isothermal conditions of the stack-PCB architecture.

In examples, a thermoplastic interposer 100 as described may be configured to be thermally coupled to one or more electronic components 204. In examples a thermoplastic interposer 100 as described may allow for direct and/or indirect transfer of a heat from an electronic component 204. In examples, as illustrated, one or more electronic components 204 may be provided on a PCB 212 and/or complementary element 218 an extend to contact or be thermally coupled to a mezzanine element 112 of thermoplastic interposer 100.

In examples, a thermoplastic interposer 100 may be thermally coupled to one or more heat dissipating structures 128. In examples, a computing device employing a stack-PCB architecture 200 may include one or more heat dissipating structures 128. In examples, as shown in FIGS. 3A-3E, heat dissipating structure 128 may be coupled to one or more portions of an extension or wing 116 of an interposer 100. In examples, one or more heat dissipating structures 128 may further be thermally coupled to a PCB 212, a complementary element 218, an electronic component 204, or any combination thereof. In examples, a heat dissipating structure 128 may assist in dissipating heat from interposer 100 and/or stack-PCB architecture 200. In examples, a heat dissipating structure 128 may be arranged to transfer heat from at least a portion of interposer 100 and/or stack-PCB architecture 200 to a housing or other structure proximate to and/or surrounding thermoplastic interposer 100 and/or the stack-PCB architecture 200. In examples, a heat dissipating structure 128 may include a heat exchanger configured to transfer heat. In examples, heat dissipating structure 128 may include one or more fins. In examples, heat dissipating structure 128 may include a thermally conductive material. In examples, heat dissipating structure 128 may include aluminum.

In examples, a heat dissipating structure 128 may be employed in conjunction with a fan 136 or other venting device as for example shown in FIGS. 3A-3C. In examples, a fan may be arranged to efficiently cause air flow across the heat dissipating structure 128. In examples, a computer fan and a heat dissipating structure 128 may be arranged so that maximum air flow may pass across the surface of the heat dissipating structure 128 to maximize heat dissipation. Maximizing air flow across heat dissipating structure 128 may increase the cubic feet per minute rate of air flow through the computing package and thus improve the cooling of the stack-PCB architecture and/or components thermally coupled to interposer 100.

In examples, a fan 136 may be arranged so that the stack-PCB architecture and/or heat dissipating structure 128 may be arranged to be aligned with the airflow caused by the fan. In examples, the fan 136 may be arranged and/or aligned so that airflow caused by the fan may be directed to flow across a surface of the heat dissipating structure 128.

In examples, one or more heat dissipating structures 128 may be connect to and/or thermally coupled to an interposer 100 and/or an extension or wing 116 by any suitable means. In examples, the connection and/or thermal coupling may be made via thermal adhesive and/or thermal paste. In examples, the connection and/or thermal coupling may be made via a thermally conductive epoxy compound, silicon compound, or any combination thereof. In examples, the connection and/or thermal coupling may be made via one or more mechanical fasteners such as screws, bolts, fitting, clips, clamps, rivets, push pins, brackets, or other like devices. Any combination of adhesive, paste, and mechanical fastener may also be employed.

In examples, the interposer 100 may have a different shape, e.g., not necessarily flat for placement between two sheets, e.g., two substantially flat PCBs of a stack-PCB architecture, e.g., stack-PCB architecture 200. For example, the interposer 100 may comprise a thermal interface material (TIM) having a three-dimensional, non-flat shape that may be placed between two surfaces of a device, two surfaces of two different devices, or multiple surfaces of multiple devices.

Figure 6:
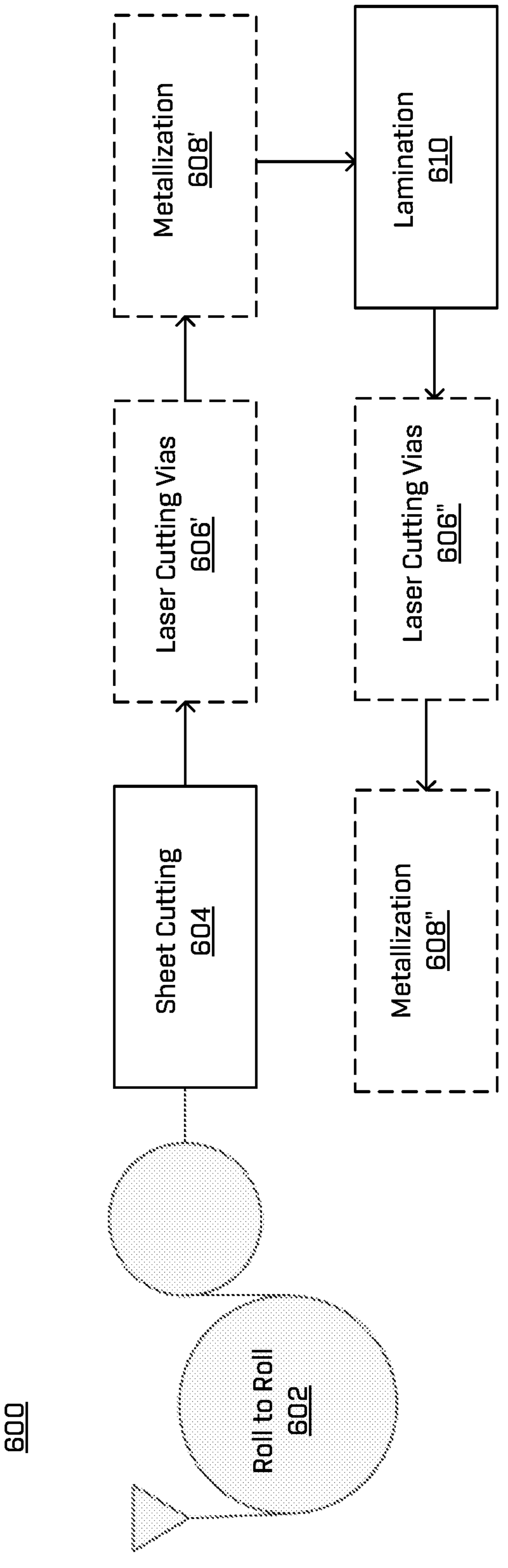
FIG. 6 illustrates an example of a process diagram for the manufacturing of a thermoplastic interposer as described herein.

FIG. 6 illustrates a diagram for an example process flow 600 to manufacture a thermoplastic interposer 100 as described herein. In examples, as shown, the thermoplastic polymer sheets may be formed and stretched using a roll-to-roll (R2R) process 602. In examples, the R2R process 602 may include melt casting and/or compacted resins. In examples, to form the thermoplastic polymer sheet, a resin (normally in the powder form) may be compacted and sintered at temperatures below the melting point (e.g., a melting point of about 125° C. to 137° C.) to densities greater than about 0.9 g/cc, 0.95 g/cc, or 0.97 g/cc. In examples, the compacted film may then undergo a uniaxial deformation either using length orientation mechanism or true uniaxial deformation using Linear Simultaneous Stretching Machine (LISIM) in a R2R process.

In examples, the stretching conditions may include temperature, strain rate, and draw ratio such as, but not limited to, those described in U.S. application Ser. No. 17/730,371, filed on 27 Apr. 2022, which is incorporated herein by reference.

In examples, the thermoplastic polymer may include a high molecular weight polymer. In examples, the thermoplastic polymer may include HMWPE. In examples, the thermoplastic polymer may include a polymer other than HMWPE, for example polyacetylene, polythiophene, poly p-phenylene, poly (p-phenylene benzobisthiazole), polyhydroquinone-diimidazopyridine, polyketone, Nylon 6,6, Kevlar, or any combination thereof. In examples, the thermoplastic polymer may include one or more additives such as metal oxide or mixed-metal oxide such as, for example, Cu2O, CuO, CuCl2, and the like.

In examples, the thermoplastic polymer sheet or layer obtained from process 602 may exhibit a draw ratio of 50 or more or 100 or more. In examples, a stretched thermoplastic polymer sheet or layer may exhibit a degree of ordered polymer chains. In examples, the stretched and thus ordered polymer sheet may have a thickness that is 25 μm or greater. In examples, the stretched polymer sheet may have a thickness of at least 50 μm, or of at least 100 μm. In examples, the stretched polymer sheet or layer may have a density of less than 1 g/cm$^3$. In examples, the stretched polymer sheet or layer may exhibit an elastic modulus of 60 GPa or greater, for example 80 GPa, 100 GPa, or 150 GPa. In examples, the stretched polymer sheet or layer may have a thermal conductivity of 5 W/mK or greater, for example 10 W/mK, 25 W/mK, or 50 W/mK.

In examples, the ordering of polymer chains in the stretched polymer sheet can be indirectly measured using thermal conductivity (>5 W/mK) elastic modulus greater than 30 GPa, for example 50 GPa, 80 GPa, or 150 GPa. In examples, the ordering may be measured using small angle x-ray scattering and calculating the order parameter using the first Legendre polynomial with the values greater than 0.9, for example, 0.95 or 0.99.

In examples, each stretched and thus ordered polymer sheet may be cut to desired sheet or layer size at 604 using a laser cutting unit. In examples, all ordered polymer sheets or layers may have the same size. In examples, at least one ordered polymer sheet or layer may have a size different from the rest and/or include one or more protrusions no present it at least one other ordered polymer sheet or layer. In examples, a differently sized ordered polymer sheet or layer and/or an ordered polymer sheet or layer with one or more protrusions may be configured to form one or more extensions or wings 116 as previously described when laminated to one or more other ordered polymer sheets or layers cut at 604. In examples, the LPU may include a high speed laser.

In examples, an ordered polymer sheet may be laser cut at 606' and/or 606" to form one or more vias and one or more pads and/or traces. In examples, one or more vias may be formed as previously described using a laser processing unit (LPU) either before or after forming a laminate interposer structure 102. In examples, the LPU may include a high speed laser. Similarly, in examples, an ordered polymer sheet in which one or more vias have been formed may be metallized at 608 to completed one or more connection points 130 including one or more TSVs or through-chip vias 132, and/or one or more pads and/or or traces 134 as previously described either before or after stacking and lamination at 610.

In examples, one or more pads and/or traces may be formed employing an LDS process as previously described. The pads and/or traces may then be metallized at 608.

In examples, an ordered polymer sheet may be laser cut at 606' to form one or more vias and/or one or more pads and/or traces, including an LDS process as previously described, may including employing a laser processing unit (LPU) before forming a laminate interposer structure 102 at 610. In examples, a laminate interposer structure 102 formed at 610 may be laser cut at 606" to form one or more vias as well as laser treated for activation in an LDS process as previously described using one or more laser processing units (LPUs).

In examples, an ordered polymer sheet or layer and/or a laminate interposer structure 102 that includes TSV or through-chip vias 132 may be metallized at 608 to form one or more pads and/or traces 134 and/or conductive connections 142 in the TSV or through-chip vias 132. In examples, the metallization 608 is performed after the formation of TSV or through-chip vias 132 at 606' or 606". In examples, metallization 608 may be performed at 608', prior to forming laminate interposer structure 102 at 610 or at 608", and/or after forming laminate interposer structure 102 at 610. In examples, metallization 608 may or may not immediately follow laser cutting at 606. In examples, lamination at 610 may occur between laser cutting at 606 and metallization at 608.

In examples, metallization 608 may include forming metal pads and/or metal traces and/or conductive connections including a metallic material such as copper or a conductive epoxy. In examples, metallic materials can be deposited onto the treated thermoplastic polymer surface during the metallization process and good adhesion between the deposited metal layer and the thermoplastic polymer can be established. In examples, metallization may include laser direct structuring (LDS), mechanical placement of conductive metal plugs (e.g. copper, silver, etc.), filling the via holes with conductive epoxy (e.g., silver adhesive epoxy) and then curing the epoxy, filling the via holes with compressed mold ultra-high molecular weight polyethylene (UHMWPE) resin with silver concentrations greater than 20 wt/wt, for example 40 wt/wt or higher, or 60 wt/wt or higher, or any combination thereof. In examples, a cured conductive epoxy may include a combination of silver adhesive epoxy and compressed mold UHMWPE. In examples, metallization at 608' and/or 608" may include electroless plating, electroplating, or a combination thereof. In examples, metallization at 608' and/or 608" may include depositing a metal such as copper or other metallic material such as a cured conductive epoxy on a laser treated region and the desired conductive connections 142 and/or pads and/or traces 134 may be formed to map the I/Os to the bump pillars on the thermoplastic interposer 100.

In examples, at 610 the polymer sheets may be stacked and pressed under heat to form a laminate interposer structure 102. In examples, at 610 the aligned ordered polymer sheets may be compressed and heated to form a laminate interposer structure 102. In examples, the lamination can be performed using high temperature, high pressure compression molding with the pressure greater than about 10 to 60 bar and a temperature that is less than melting temperature of the polymer, for example less than 125° C. to 135° C., for 15 min to 1 hr. Adhesive layers can be high density polyethylene, low density polyethylene, liner low density polyethylene, unentangled ultra-high molecular weight polyethylene powder. In examples, the compression may be carried out at a temperature of at least 100° C., for example at 120° C., 135° C., or 140° C. In examples, the compression may be carried out at a pressure of at least 500 bar, for example 1000 bar, or 2000 bar. In examples, the heated compression may be carried out for at least 5 min, at least 20 min, or at least 1 hr. In examples, one or more layers of adhesive and/or epoxy may be included between any two ordered polymer sheets to improve adhesion between layers in the formed laminate interposer structure 102.

In examples, ordered polymer sheets with the TSV or through-chip vias 132 formed at 606' may be aligned and stacked into a final laminate interposer structure 102 at 610. In examples, alignment of the ordered polymer sheets may include alignment of the vias 132 formed in the various ordered polymer sheets. In examples, one or more alignment marks, such as Fiducial Marks, may be used as reference points to align two or more ordered polymer sheets. In examples, if the ordered polymer sheets are not processed at 606' prior to the lamination at 610, then the laminate interposer structure 102 formed at 610 may be processed using an LPU to form the TSV or through-chip vias 132 at 606". In examples, at 606" TSV or through-chip vias 132 may be formed after the laminate interposer structure 102 is formed at 610.

Figure 7:
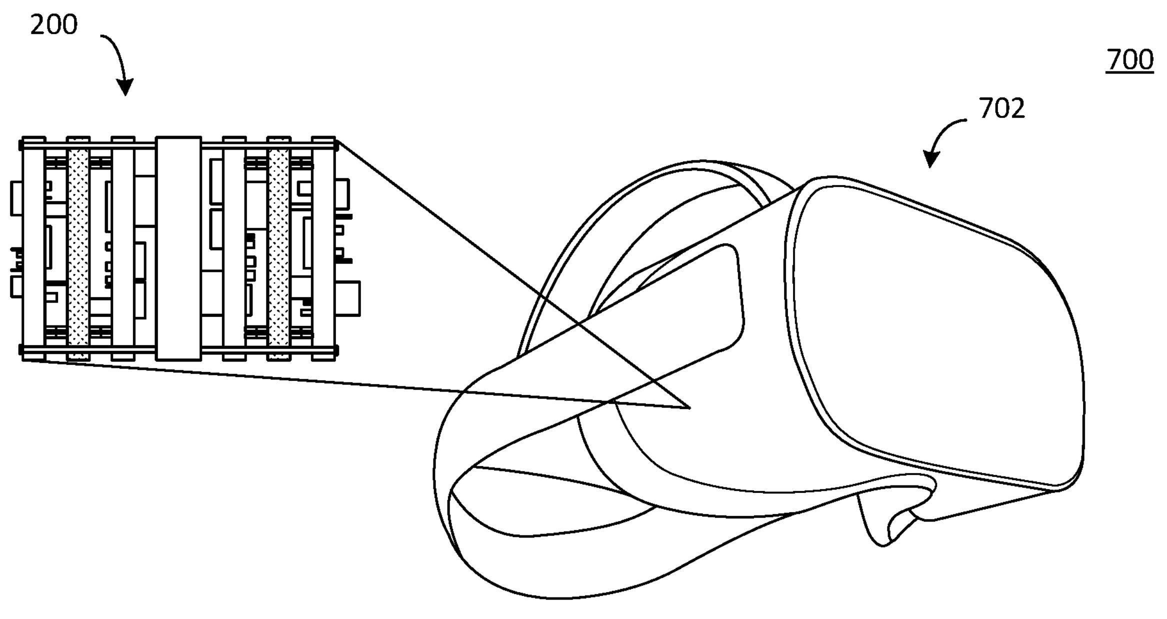
FIG. 7 illustrates product implementation examples for a stack-PCB architecture including a thermoplastic interposer as described herein.
Figure 7:
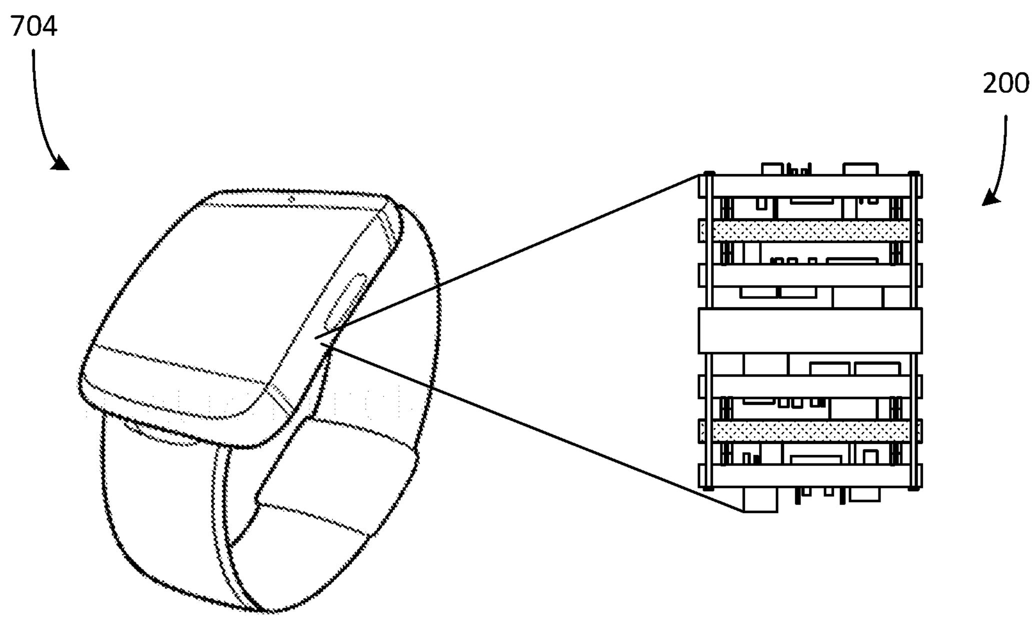

FIG. 7 illustrates an example computing device 700 in which a thermoplastic interposer 100 as described and/or the above-described stack-PCB architecture 200 with one or more interposers 100 may be employed. The computing device 700 may be any computing device as previously stated. In examples, the disclosed thermoplastic interposer 100 and/or stack-PCB architecture including one or more interposers 100 may be employed in portable computing devices such as wearable devices such as a smart watch, augmented reality computing devices, virtual reality computing devices, extended reality computing devices such as headsets and glasses, mobile phones, handheld computers, cameras, gaming devices, laptops or other portable computing devices. In examples, the disclosed thermoplastic interposer 100 and/or stack-PCB architecture including one or more interposers 100 may be employed in non-portable computing devices such as desktop computers, appliances, integrated computing components and the like. As shown in FIG. 7, computing device 700 may include, be a part of, or function in conjunction with a virtual reality device such as for example, a virtual reality headset 702 or wearable computing device such a smart watch 704. These are only examples.

In examples, the disclosed thermoplastic interposer 100 and/or stack-PCB architecture including one or more interposers 100 as described may be well suited for augmented reality (AR) and/or virtual reality (VR) devices. AR and VR devices often require high processing powers that can generate high temperatures. This is particularly when the device is shrunk to a wearable size or smaller. In examples, employing a thermoplastic interposer 100 and/or stack-PCB architecture including one or more interposers 100 as described can improve the utilization of a stack PCB structure in AR and/or VR devices. In examples, the ability to employ a thermoplastic interposer 100 and/or stack-PCB architecture including one or more interposers 100 as described in an AR and/or VR computing device may be due at least in part to the isothermal conditions that may be maintained. In examples, an AR and/or VR computing device includes one or more interposers 100 and/or stack-PCB architectures including one or more interposers 100 as described herein.

Figure 8:
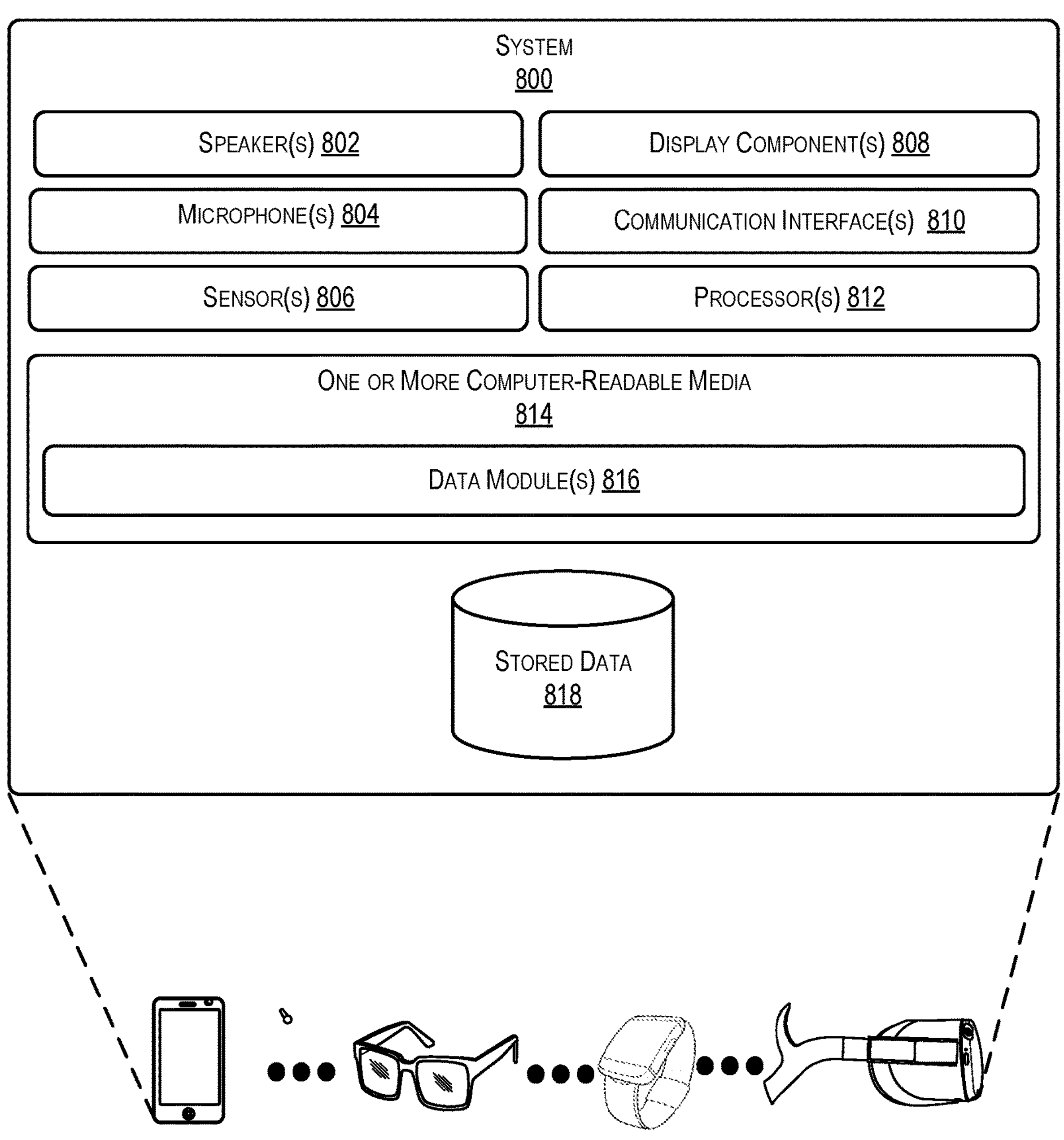
FIG. 8 is an example system that may be implemented using a stack-PCB architecture including a thermoplastic interposer as described herein.

FIG. 8 is an example system 800 that may be implemented employing a thermoplastic interposer 100 as described and/or one or more of the above-described stack-PCB architectures 200 with one or more interposers 100. The system 800 is simply an example and not intended to limit the application of the thermoplastic interposer 100 and/or stack-PCB architecture 200 including one or more interposers 100. In examples, multiple interposers 100 and/or stack-PCB architectures 200 including one or more interposers 100 may be employed to provide the logic to support one or more components of system 800. In examples, using more than one stack-PCB architecture 200, each stack-PCB architecture 200 may include one or more interposers 100. In examples, using two or more stack-PCB architectures 200, any two or more stack-PCB architectures 200 may be in communication with each other and/or interconnected. Connections between stack-PCB architectures 200 may be provided via any suitable means including flex circuits, rigid connectors, cables, or any similar device. In examples, connections between stack-PCB architectures 200 may be provided via a thermoplastic interposer 100.

In examples, system 800 may be configured to perform various functions. In the illustrated example, system 800 may be configured to provide or deliver visual and/or audio content to a user engaged with a headset device and/or one or more earbuds. In some cases, the system 800 may include a speaker 802 which may incorporate one or more drivers as described herein, where the speaker 802 and/or driver is in proximity to or shares a structure/substrate with a microphone 804.

In examples, a microphone 804 may be configured to generate audio data and/or an audio signal representative of noise or sound in an associated environment, such as the environment surrounding a user, an ear canal of a user, and the like. In some instances, the microphone may be configured to detect noise or sound originating from a particular direction or specific relative areas (such as a mount of a user). In examples, one or more sensing components of microphone 804 may be implemented either as a functional PCB and/or as a sensors board provided as a complementary element 218.

The system 800 may also include one or more sensors 806 or other device for generating vibrational data associated with the system 800. For example, in some cases, the sensors 806 may comprise one or more IMUs, accelerometers, gyroscopes, magnetometers, or a combination thereof. For instance, in one implementation, sensors 806 may comprise three accelerometers placed orthogonal to each other, three rate gyroscopes placed orthogonal to each other, three magnetometers placed orthogonal to each other, and a barometric pressure sensor to provide mechanical vibration data or signals along three axes. In examples, the sensor boards operational in the one or more sensors 806 may also be implemented as either a functional PCB, or as a complementary element 218. In examples, one or more sensors logics may be included in a system on chip PCB.

In some examples, the system 800 may also include display components 808 for providing or presenting visual content to a user. For example, the display components 808 may present two-dimensional visual content or three-dimensional visual content (such as virtual reality content, mixed reality content, or augmented reality content). The display components 808 may be reflective, emissive, or a combination of both. In some examples, the display components 808 may include electrophoretic displays, interferometric modulator displays, cholesteric displays, backlit liquid crystal displays (LCDs), light emitting diode (LED) displays, waveguides, and so forth. In examples, display logic associated with display components 808 may include one or more heavy load electronic components 204. In examples, the electronic components 204 associated with display components 808 may be provided on a separate board assembly 202 such as PCB 212 and/or complementary element 218. In examples, the PCB 212 and/or complementary element 218 hosting the one or more electronic components 204 of display component 808 may be arranged to be thermally coupled to a thermoplastic interposer 100 and/or to a mezzanine element 112 of a thermoplastic interposer 100.

In examples, system 800 may include one or more communication interfaces 810 configured to facilitate communication between one or more networks, one or more cloud-based system, and/or one or more physical objects, such as hand-held controller. The communication interfaces 810 may also facilitate communication between one or more wireless access points, a master device, and/or one or more other computing devices as part of an ad-hoc or home network system. The communication interfaces 810 may support both wired and wireless connection to various networks, such as cellular networks, radio, WiFi networks, short-range or near-field networks (e.g., Bluetooth®), infrared signals, local area networks, wide area networks, the Internet, and so forth. In some cases, the communication interfaces 810 may be configured to couple the earbuds wirelessly and communicatively to the headset device. In examples, communication interface 810 may include logics mounted onto a functional PCB, such as for example an RF board, and/or a complementary element 218 of a stack-PCB architecture 200 with one or more interposers 100.

In examples, system 800 may also include one or more processors 812, such as at least one or more access components, control logic circuits, central processing units, or processors, as well as one or more computer-readable media 814 to perform the function associated with the virtual environment. Additionally, each of the processors 812 may itself comprise one or more processors or processing cores. In examples, one or more processors 812 may be provided on a system on chip PCB of a stack-PCB architecture 200 with one or more interposers 100. In examples, the one or more processors 812 can include any suitable processor depending on the application for the device. In examples, one or more processors 812 may include CPUs, graphic processing units (GPUs), holographic processors, other microprocessors, as well as microcontrollers, FPGAs, ASICs, DDICs, etc.

Depending on the configuration, the computer-readable media 814 may be an example of tangible non transitory computer storage media and may include volatile and non-volatile memory and/or removable and non-removable media implemented in any type of technology for storage of information such as computer readable instructions or modules, data structures, program modules or other data. Such computer readable media may include, but is not limited to, RAM, ROM, EEPROM, flash memory or other computer-readable media technology, CD-ROM, digital versatile disks (DVD) or other optical storage, magnetic cassettes, magnetic tape, solid state storage, magnetic disk storage, RAID storage systems, storage arrays, network attached storage, storage area networks, cloud storage, or any other medium that can be used to store information and which can be accessed by the processors 812. In examples, computer-readable media 814 may be housed on a system on chip PCB, a functional PCB, and/or one or more complementary elements 218.

In examples, one or more data modules 816 such as instruction, data stores, and so forth may be stored within the computer-readable media 814 and configured to execute on the processors 812. By way of example and not limitation, the data module(s) 816 may include software programs such as an operating system, one or more application programs such as internet browsing software, extended reality software, audio and/or video media player software, gaming software, camera capture software, image viewer and/or editor software, social networking software, productivity software (e.g., computer aided design, word processing software, database software, spreadsheets software, drawing software, animation software, video editing software, etc.), communications software (e.g., email, text/video/voice messaging, voice and/or video calling, conferencing, etc.), and/or any other software commonly used in connection with portable computing devices.

As noted above, in some examples, the stacked PCB architecture described herein may be used in portable computing devices such as, but not limited to, head-mounted devices (e.g., a headset, glasses, visor, etc.) or other wearable device (e.g., gloves, suit, etc.). Such extended reality devices may include extended reality headsets that allow users to view, create, consume, and/or share media content. In some examples, extended reality headsets may include a display structure having a display which is placed over eyes of a user and allows the user to "see" or otherwise perceive the extended reality content or environment. As discussed further below, the term "extended reality" includes virtual reality, mixed reality, and/or augmented reality.

As used herein, the term "extended reality environment" refers to a simulated environment in which users can fully or partially immerse themselves. For example, an extended reality environment can comprise virtual reality, augmented reality, mixed reality, etc. An extended reality environment can include computer generated objects and elements with which a user can interact. In many cases, a user participates in an extended reality environment using a computing device, such as a dedicated extended reality device. As used herein, the term "extended reality device" refers to a computing device having extended reality capabilities and/or features. In examples, an extended reality device can refer to a computing device that can display an extended reality graphical user interface. An extended reality device can further display one or more visual elements within the extended reality graphical user interface and receive user input that targets those visual elements. In particular, an extended reality device can include any device capable of presenting a full or partial extended reality environment.

In some examples, an extended reality computing device includes a display structure that is placed over eyes of a user to display content to the user. The display structure may include one or more input devices (e.g., microphones, speakers, buttons, sensors, etc.) and one or more output devices (e.g., displays, projectors, speakers, etc.) that are contained within a housing of the extended reality computing device. The housing of the headset may also house one or more other components of the headset. For example, the headset may include the stacked PCB architecture described here, which may include or be coupled to one or more other electrical components.

In examples, the computing device may be required to run intensive software and can benefit from the heat management and dissipation of the thermoplastic interposer 100 and/or stack-PCB architecture including one or more interposers 100 described herein. For example, some of the types of software (e.g., extended reality, gaming, video rendering, animation, computer aided design, etc.) running on a computing device can be computationally intensive and therefore generate considerable amounts of heat. In examples, the thermoplastic interposer 100 and/or stack-PCB architecture including one or more interposers 100 as described can distribute and dissipate the generated heat more effectively than conventional systems. This in turn may allow for more efficient functionality with decreased risk of overheating.

The computer-readable media 814 may also store data usable by the various instructions modules 816 and generated by the various components 802-808. The stored data 818 is not particularly limited and may include sensor data, program data, output data, transfer functions or the like.

The foregoing description has been presented for illustration; it is not intended to be exhaustive or to limit the scope of the disclosure to the precise forms disclosed. Persons skilled in the relevant art can appreciate that many modifications and variations are possible considering the above disclosure.

Some portions of this description describe the examples in terms of algorithms and symbolic representations of operations on information. These algorithmic descriptions and representations may be used by those skilled in the data processing arts to convey the substance of their work effectively to others skilled in the art. These operations, while described functionally, computationally, or logically, are understood to be implemented by computer programs or equivalent electrical circuits, microcode, or the like. The described operations and their associated components may be embodied in software, firmware, hardware, or any combinations thereof.

Any of the steps, operations, or processes described herein may be performed or implemented with one or more hardware or software modules, alone or in combination with other devices. In examples, a software module is implemented with a computer program product comprising a computer-readable medium containing computer program code, which can be executed by a computer processor for performing any or all the steps, operations, or processes described.

Examples may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Examples may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. An interposer comprising:

a laminate structure comprising two or more thermoplastic ordered polymer layers including a thermoplastic mezzanine element;

one or more connection points, each connection point comprising a through chip via; and an internal region relative to an outer boundary of the laminate structure.

2. The interposer of claim 1, wherein the thermoplastic mezzanine element is aligned with the internal region.

3. The interposer of claim 1, wherein the thermoplastic mezzanine element is thinner than a peripheral portion of the laminate structure.

4. The interposer of claim 1, the laminate structure further comprising an opening at the internal region.

5. The interposer of claim 1, further comprising a metal plating over at least each connection point.

6. The interposer of claim 1, further comprising an extension protruding from one or more sides of the laminate structure.

7. The interposer of claim 6, wherein the extension is thermally coupled to the laminate structure.

8. The interposer of claim 1, wherein each of the one or more thermoplastic ordered polymer layers comprises a high molecular weight polymer.

9. The interposer of claim 1, wherein each of the one or more thermoplastic ordered polymer layers comprises high molecular weight polyethylene.

10. The interposer of claim 1, wherein the one or more connection points comprise an ultra-high molecular weight polyethylene.

11. A tri-layer structure comprising:

a first printed circuit board;

a second printed circuit board; and a thermoplastic interposer comprising one or more sheets of ordered polymers including a thermoplastic mezzanine element, the thermoplastic interposer being positioned between the first printed circuit board and the second printed circuit board and coupled to the first printed circuit board and to the second printed circuit board.

12. The tri-layer structure of claim 11, wherein the thermoplastic mezzanine element is within an internal region of a laminate interposer structure.

13. The tri-layer structure of claim 11, wherein at least one of the first printed circuit board and the second printed circuit board comprises one or more electronic components thermally coupled to the thermoplastic interposer.

14. The tri-layer structure of claim 12, wherein the thermoplastic mezzanine element is thinner than a peripheral portion of the interposer laminate structure.

15. The tri-layer structure of claim 11, further comprising an extension protruding from a side of the thermoplastic interposer.

16. The tri-layer structure of claim 11, further comprising:

one or more connection points, each connection point comprising a through chip via; and a metal plating over at least each connection point.

17. The tri-layer structure of claim 16, wherein the one or more connection points comprise an ultra-high molecular weight polyethylene.

18. A stack-PCB architecture comprising:

a core frame;

two or more printed circuit boards on a first side of the core frame, the two or more printed circuit boards interconnected by one or more first interposers; and two or more complementary elements on the second side of the core frame, the second side of the core frame being opposite the first side of the core frame, the two or more complementary elements interconnected by one or more second interposers, wherein at least one of the first interposers or second interposers comprises a thermoplastic interposer comprising a laminate structure of two or more ordered polymer sheets.

19. The stack-PCB architecture of claim 18, the core frame further comprising a heat spreader.

20. The stack-PCB architecture of claim 18, the thermoplastic interposer further comprising an extension protruding from an outer boundary of the laminate structure.

* * * * *